US011302400B2

(12) United States Patent
Tsukamoto

(10) Patent No.: US 11,302,400 B2
(45) Date of Patent: Apr. 12, 2022

(54) SEMICONDUCTOR DEVICE AND MEMORY SYSTEM

(71) Applicant: Kioxia Corporation, Tokyo (JP)

(72) Inventor: Takayuki Tsukamoto, Yokohama Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 17/010,198

(22) Filed: Sep. 2, 2020

(65) Prior Publication Data

US 2021/0287753 A1 Sep. 16, 2021

(30) Foreign Application Priority Data

Mar. 11, 2020 (JP) ............................ JP2020-042001

(51) Int. Cl.
*G11C 16/30* (2006.01)
*G06F 3/06* (2006.01)

(52) U.S. Cl.
CPC ............ *G11C 16/30* (2013.01); *G06F 3/0625* (2013.01); *G06F 3/0634* (2013.01)

(58) Field of Classification Search
CPC ...... G11C 16/30; G06F 3/0625; G06F 3/0634
See application file for complete search history.

(56) References Cited

U.S. PATENT DOCUMENTS 8,981,750 B1 3/2015 Meher et al.
9,602,003 B2 3/2017 Otsuka
2005/0088154 A1* 4/2005 Sugiura .................. G05F 3/247 323/281
2005/0151527 A1* 7/2005 Noda ...................... G05F 3/242 323/313
2012/0280667 A1* 11/2012 Drebinger ............... G05F 1/575 323/273
2013/0033247 A1* 2/2013 Endo ....................... G05F 1/575 323/282
2013/0119954 A1* 5/2013 Lo ............................ G05F 1/10 323/280
2013/0257401 A1* 10/2013 Fort .......................... G05F 1/46 323/280
2014/0239928 A1* 8/2014 Taniguchi ............... G05F 1/575 323/273
2014/0266105 A1* 9/2014 Li ........................... G05F 1/565 323/280

(Continued)

FOREIGN PATENT DOCUMENTS

JP 2014-006780 A 1/2014

*Primary Examiner* — Jay W. Radke
(74) *Attorney, Agent, or Firm* — Foley & Lardner LLP

(57) ABSTRACT

A semiconductor device includes a first transistor; a first resistor; a second resistor; a first circuit configured to apply a first voltage to the first transistor. The first voltage is based on a difference between a reference voltage and an output voltage divided by the first and second resistors. A first current through the first circuit in a first mode is less than a second current through the first circuit in a second mode. The semiconductor device includes a capacitor connected to the output terminal; and a second circuit connected to the capacitor that: (a) disconnects the first circuit from the capacitor and apply a second voltage to the capacitor in a first mode, and (b) electrically connects the first circuit to the capacitor in the second mode.

15 Claims, 23 Drawing Sheets

(56) References Cited

U.S. PATENT DOCUMENTS

| | | | | |
|---|---|---|---|---|
| 2015/0277458 | A1* | 10/2015 | Suzuki | G05F 1/56 |
| | | | | 323/280 |
| 2017/0205840 | A1* | 7/2017 | Ogura | H03K 5/24 |
| 2019/0227587 | A1* | 7/2019 | Mikhael | G05F 3/30 |
| 2020/0379492 | A1* | 12/2020 | Sakaguchi | G05F 1/59 |

* cited by examiner

SEMICONDUCTOR DEVICE AND MEMORY SYSTEM

CROSS-REFERENCE TO RELATED APPLICATION(S)

This application is based upon and claims the benefit of priority from Japanese Patent Application No. 2020-042001, filed on Mar. 11, 2020, the entire contents of which are incorporated herein by reference.

FIELD

Embodiments described herein relate generally to a semiconductor device and a memory system.

BACKGROUND

A semiconductor device and a memory system including a series regulator are known.

DETAILED DESCRIPTION

Embodiments provide a semiconductor device and a memory system which are capable of improving a processing capacity thereof.

In general, according to one embodiment, a semiconductor device having a regulator having first and second operation modes. The regulator includes: a first transistor including a first end configured to be connected to a power supply voltage and a second end connected to an output terminal; a first resistor having a first end connected to the first transistor and the output terminal; a second resistor having a first end connected to a second end of the first resistor and a second end connected to a ground voltage; a first circuit configured to apply a first voltage to a gate of the first transistor, wherein the first voltage is determined based on a difference between a reference voltage and an output voltage divided by the first and second resistors, and wherein a first bias current flowing through the first circuit in the first operation mode is less than a second bias current flowing through the first circuit in the second operation mode; a capacitor including a first electrode connected to the output terminal; and a second circuit connected to a second electrode of the capacitor and configured to: (a) electrically disconnect the first circuit from the first capacitor and apply a second voltage to the first capacitor in the first operation mode, and (b) electrically connect the first circuit to the capacitor in the second operation mode.

Each functional block may not necessarily be distinguished as in the following examples. For example, some functions may be executed by functional blocks different from illustrated functional blocks. Furthermore, the illustrated functional block may be divided into further detailed functional sub-blocks. The embodiments are not limited by which any functional blocks are specified.

In the present specification and claims, when one first element is referred to as being "connected to" another second element, the first element is directly or always or selectively connected to the second element via an element that is electrically conductive.

1. First Embodiment

A semiconductor device according to a first embodiment will be described. Hereinafter, a memory system will be described as an example of the semiconductor device.

1.1 Configuration

1.1.1 Configuration of Memory System

Figure 1:
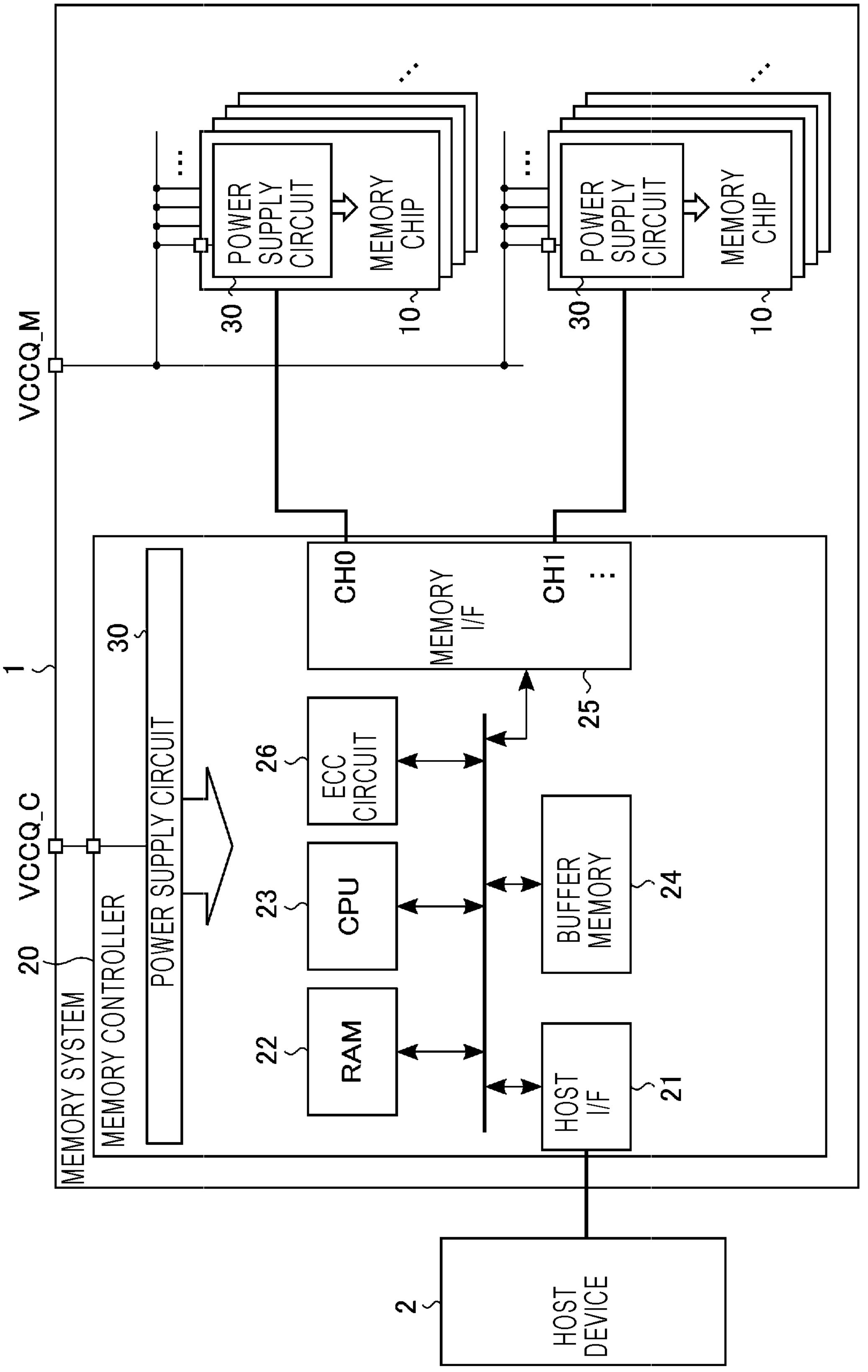
FIG. 1 is a block diagram of a semiconductor device according to a first embodiment.

First, an example of a configuration of the memory system will be described with reference to FIG. 1. FIG. 1 is a block diagram illustrating an example of a configuration of the memory system 1.

As illustrated in FIG. 1, the memory system 1 includes a plurality of nonvolatile memory chips 10 and a memory controller 20, and is connected to an external host device 2. The nonvolatile memory chips 10 and the memory controller 20 constitute one memory system 1 by, for example, a combination thereof. Examples of such a memory system 1 may include a memory card such as an SD™ card, a Solid State Drive (SSD), an embedded Multimedia Card (eMMC), and a Universal Flash Storage (UFS). Hereinafter, the respective nonvolatile memory chips 10 will be simply referred to as the memory chip 10.

Each of the memory chip 10 and the memory controller 20 includes a power supply circuit 30. The power supply circuit 30 supplies a power supply voltage to each circuit provided in the memory chip 10 or the memory controller 20. A case where the power supply circuit 30 of the memory chip 10 and the power supply circuit 30 of the memory controller 20 have the same circuit configuration will be described below. In addition, the power supply circuit 30 in the memory chip 10 and the power supply circuit 30 in the memory controller 20 may have different circuit configurations.

The power supply circuit 30 in the memory chip 10 is supplied with a voltage VCCQ_M from the outside (e.g., the host device 2). Further, the power supply circuit 30 in the memory controller 20 is supplied with a voltage VCCQ_C from the outside (e.g., the host device 2). The voltage VCCQ_M and the voltage VCCQ_C may have the same voltage value or different voltage values.

The memory chip 10 is, for example, a semiconductor chip in which a nonvolatile memory such as an NAND flash memory is built. The NAND flash memory may be, for example, a three-dimensionally stacked NAND flash memory. An example of the memory chip 10 as a three-dimensionally stacked NAND flash memory will be described below.

The memory controller 20 commands the memory chip 10 to perform a data read operation, a data write operation, or a data erase operation, for example, in response to a request (command) from the host device 2. The memory controller 20 may be, for example, a system on a chip (SoC). In addition, each function of the memory controller 20 may be implemented by a dedicated circuit, or may be implemented as a processor executes firmware. In the present embodiment, a case where a dedicated circuit is provided in the memory controller 20 will be described.

The memory controller 20 includes a host interface (host I/F) circuit 21, a Random Access Memory (RAM) 22, a Central Processing Unit (CPU) 23, a buffer memory 24, a memory interface (memory I/F) circuit 25, and an Error Check and Correction (ECC) circuit 26. These circuits are connected to each other via an internal bus.

The host interface circuit 21 is connected to the host device 2 by a host bus and takes charge of communication with the host device 2. For example, the host interface circuit 21 transfers commands and data received from the host device 2 to the CPU 23 and the buffer memory 24, respectively. Further, the host interface circuit 21 transfers, for example, data in the buffer memory 24 to the host device 2 in response to a command from the CPU 23.

The RAM 22 is, for example, a semiconductor memory such as a DRAM, and stores, for example, firmware or various management tables for managing the memory chip 10. Further, the RAM 22 is also used as a work area for the CPU 23.

The CPU 23 controls an operation of the overall memory controller 20. The CPU 23 controls the host interface circuit 21, the RAM 22, the buffer memory 24, the memory interface circuit 25, and the ECC circuit 26. For example, the CPU 23 issues a write command in response to a write command received from the host device 2 and transmits the issued write command to the memory interface circuit 25. This operation is the same for a read command and an erase command. Further, the CPU 23 executes various processes for managing the memory space of the memory chip 10 such as wear leveling.

The buffer memory 24 temporarily stores, for example, read data received by the memory controller 20 from the memory chip 10 and write data received by the memory controller 20 from the host device 2.

The memory interface circuit 25 is connected to the memory chip 10 and takes charge of communication with the memory chip 10. In the example of FIG. 1, the memory interface circuit 25 has two channels CH0 and CH1. Then, the plurality of memory chips 10 are connected to the channels CH0 and CH1. For example, at the time of a write operation, the memory interface circuit 25 transmits written data in the buffer memory 24, an address signal, a write command issued by the CPU 23, and various control signals to the memory chip 10. Further, for example, at the time of a read operation, the memory interface circuit 25 transmits an address signal, a read command issued by the CPU 23, and various control signals to the memory chip 10 and transmits read data received from the memory chip 10 to the buffer memory 24.

The ECC circuit 26 executes an Error Checking and Correcting (ECC) processing of data.

1.1.2 Configuration of Memory Chip

Figure 2:
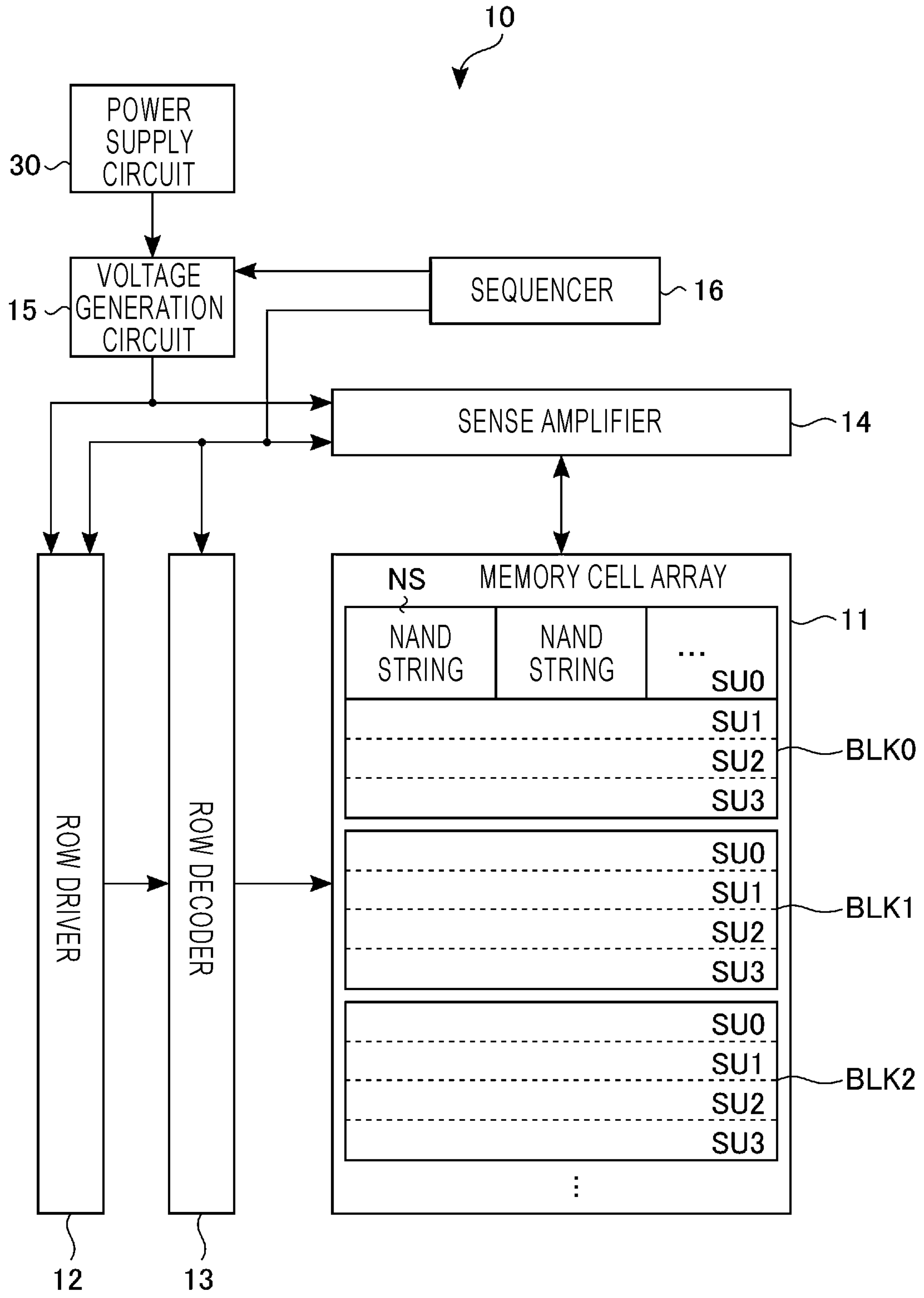
FIG. 2 is a block diagram of a memory chip provided in the semiconductor device according to the first embodiment.

Next, an example of the overall configuration of the memory chip 10 will be described with reference to FIG. 2. FIG. 2 is a block diagram illustrating an example of a configuration of the memory chip 10.

As illustrated in FIG. 2, the memory chip 10 includes a power supply circuit 30, a memory cell array 11, a row driver 12, a row decoder 13, a sense amplifier 14, a voltage generation circuit 15, and a sequencer 16.

The memory cell array 11 includes a plurality of blocks BLK (BLK0, BLK1, BLK2, . . . ). Each of the blocks BLK includes a plurality of (four in the present embodiment) string units SU (SU0 to SU3). The string unit SU is a set of a plurality of NAND strings NS in which a plurality of memory cell transistors are connected in series. In addition, the number of blocks BLK in the memory cell array 11 and the number of string units SU in the block BLK are freely selected.

The row driver 12 supplies a voltage applied from the voltage generation circuit 15 to the row decoder 13 based on an address signal (e.g., page address signal) received from, for example, the memory controller 20.

The row decoder 13 decodes a row address based on an address signal (e.g., block address signal) received from, for example, the memory controller 20. The row decoder 13 selects any of the blocks BLK based on the decoding result and interconnects the selected block BLK and the row driver 12.

The sense amplifier 14 senses data read from any string unit SU of any block BLK when reading data. Further, the sense amplifier 14 supplies a voltage depending on write data to the memory cell array 11 when writing data.

The sequencer 16 controls an operation of the entire memory chip 10. More specifically, the sequencer 16 controls, for example, the voltage generation circuit 15, the row driver 12, the row decoder 13, and the sense amplifier 14 at the time of a write operation, a read operation, and an erase operation.

The voltage generation circuit 15 is supplied with a power supply voltage supplied from the power supply circuit 30. The voltage generation circuit 15 generates a voltage used for a write operation, a read operation, and an erase operation and supplies the voltage to the row driver 12 and the sense amplifier 14, for example, based on the control of the sequencer 16.

1.1.3 Circuit Configuration of Memory Cell Array

Figure 3:
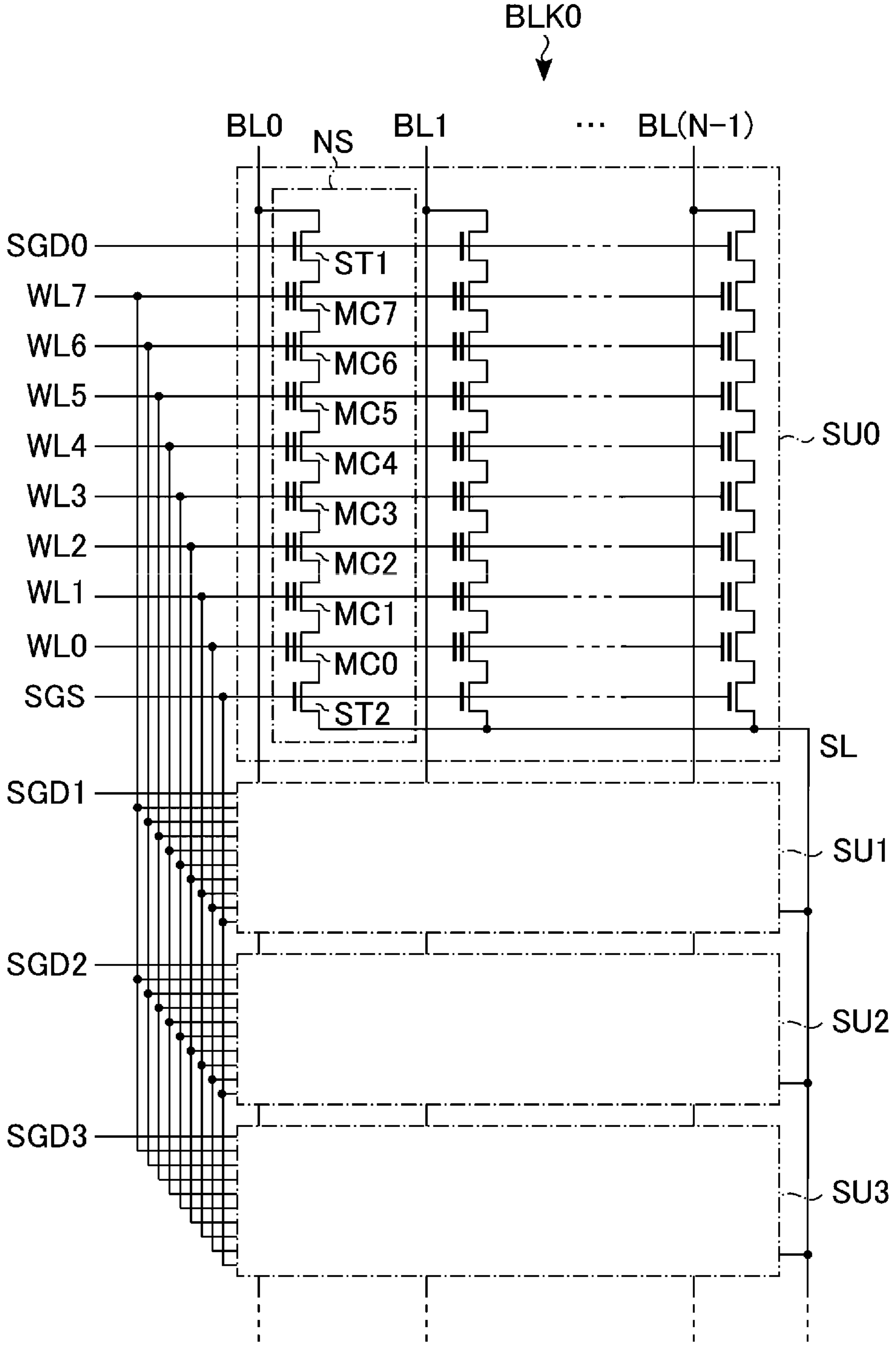
FIG. 3 is a circuit diagram of a memory cell array in the memory chip provided in the semiconductor device according to the first embodiment.

Next, a circuit configuration of the memory cell array 11 will be described with reference to FIG. 3. FIG. 3 is a diagram illustrating an example of a circuit configuration of the memory cell array 11. The example of FIG. 3 illustrates the block BLK0, but configurations of the other blocks BLK are also the same.

As illustrated in FIG. 3, the block BLK0 includes, for example, four string units SU0 to SU3. Then, each string unit SU includes a plurality of NAND strings NS. Each of the NAND strings NS includes, for example, eight memory cell transistors MC (MC0 to MC7) and select transistors ST1 and ST2. The memory cell transistor MC includes a control gate and a charge storage layer, and stores data in a non-volatile manner.

In addition, the memory cell transistor MC may be of an MONOS type using an insulating film for the charge storage layer or of a floating gate (FG) type using a conductive layer for the charge storage layer. Further, the number of memory cell transistors MC in the NAND string NS is not limited to eight, and may be 16, 32, 64, 96, or 128, for example, without being limited thereto. Further, the number of select transistors ST1 and ST2 in the NAND string NS may be one or more.

In the NAND string NS, the respective current paths of the select transistor ST2, the memory cell transistors MC0 to MC7, and the select transistor ST1 are connected in series in this order. Then, a drain of the select transistor ST1 is connected to a corresponding bit line BL. Further, a source of the select transistor ST2 is connected to a source line SL.

Control gates of the memory cell transistors MC0 to MC7 of each NAND string NS in the block BLK are connected to different word lines WL0 to WL7. More specifically, for example, the control gates of the memory cell transistors MC0 in the block BLK0 are commonly connected to the word line WL0. The control gates of the memory cell transistors MC1 in the block BLK0 are commonly connected to the word line WL1. A relationship between the other memory cell transistors MC2 to MC7 and the word lines WL2 to WL7 is the same.

Gates of the select transistors ST1 of the respective NAND string NS in the string unit SU are connected to select gate lines SGD. More specifically, the gates of the select transistors ST1 in the string unit SU0 are commonly connected to a select gate line SGD0. The gates of the select transistors ST1 (not illustrated) in the string unit SU1 are commonly connected to a select gate line SGD1. The gates of the select transistors ST1 (not illustrated) in the string unit SU2 are commonly connected to a select gate line SGD2. The gates of the select transistors ST1 (not illustrated) in the string unit SU3 are commonly connected to a select gate line SGD3.

Gates of the select transistors ST2 in the block BLK are commonly connected to select gate line SGS. In addition, the gates of the select transistors ST2 may be connected to different select gate lines SGS for each string unit SU, like the gates of the select transistors ST1.

Drains of N (N is an integer of 1 or more) select transistors ST1 in the string unit SU are connected to different bit lines BL (BL0 to BL(N−1)), respectively. That is, the NAND strings NS in the string unit SU are connected to different bit lines BL, respectively. Further, in each block BLK, one NAND string NS in the string unit SU0, one NAND string NS in the string unit SU1, one NAND string NS in the string unit SU2, and one NAND string in the string unit SU3 are commonly connected to the bit line BL.

Sources of the select transistors ST2 in the blocks BLK are commonly connected to the source line SL.

That is, the string unit SU is a set of the NAND strings NS that are connected respectively to different bit lines BL and that are connected to the same select gate line SGD. Further, the block BLK is a set of the string units SU that share the word lines WL. Then, the memory cell array 11 is a set of the blocks BLK that share the bit lines BL.

1.1.4 Configuration of Power Supply Circuit 30

Figure 4:
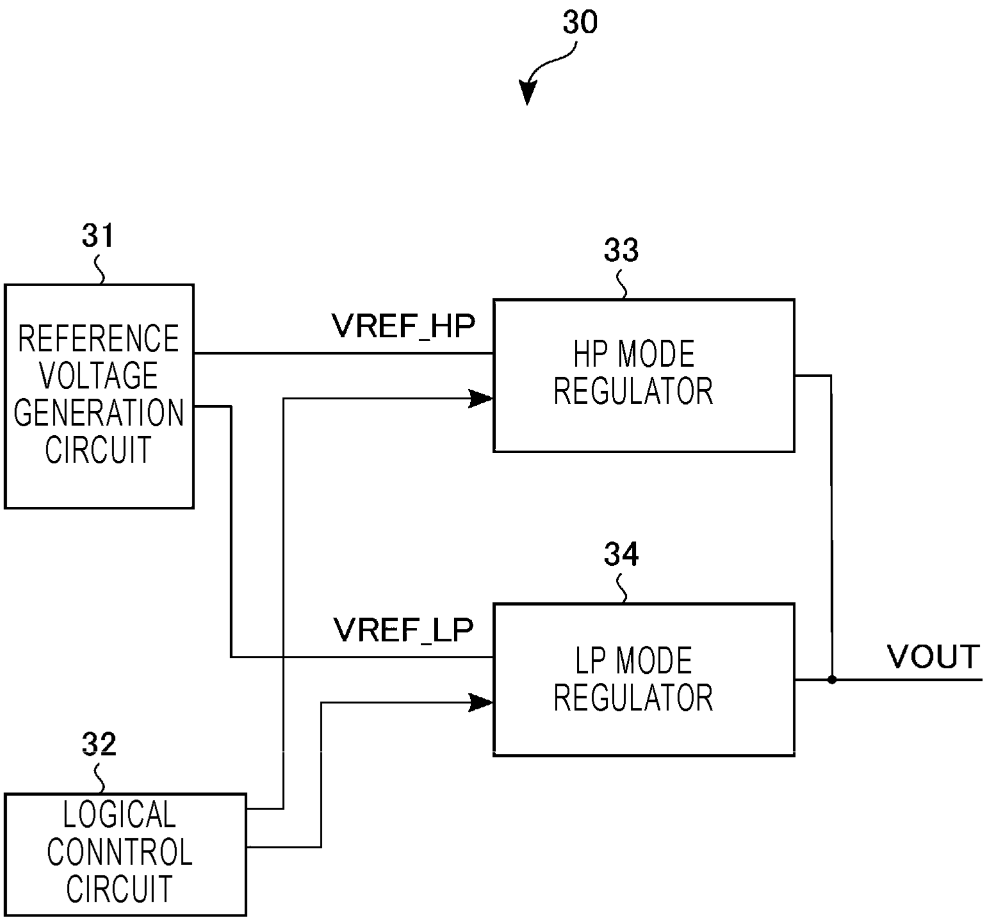
FIG. 4 is a block diagram of a power supply circuit provided in the semiconductor device according to the first embodiment.

Next, a configuration of the power supply circuit 30 will be described with reference to FIG. 4. FIG. 4 is a block diagram illustrating an example of a configuration of the power supply circuit 30. The power supply circuit 30 in the memory chip 10 will be described below, but the power supply circuit 30 in the memory controller 20 is the same.

The power supply circuit 30 of the present embodiment has two operation modes including a low power operation mode (hereinafter referred to as "LP mode") and a high power operation mode (hereinafter referred to as "HP mode"). The LP mode is, for example, an operation mode that is selected when the memory chip 10 (or the memory system 1) is in the standby state to reduce power consumption (current consumption) in the power supply circuit 30. The HP mode is selected, for example, when the memory chip 10 (or the memory system 1) is in the active state. For example, the memory controller 20 sets the power supply circuit 30 of the selected memory chip 10 which is selected for performing a write operation, for example, to the HP mode and sets the power supply circuit of the non-selected memory chip 10 to the LP mode. That is, the operation mode of the power supply circuit 30 of the memory chip 10 is switched according to a switching operation of the memory chip 10.

As illustrated in FIG. 4, the power supply circuit 30 includes a reference voltage generation circuit 31, a logical control circuit 32, an HP mode regulator 33, and an LP mode regulator 34.

The reference voltage generation circuit 31 is supplied with, for example, the voltage VCCQ_M (in case of the memory controller 20, the voltage VCCQ_C). The reference voltage generation circuit 31 supplies a reference voltage VREF_HP to the HP mode regulator 33 and supplies a reference voltage VREF_LP to the LP mode regulator 34. The voltage VREF_HP and the voltage VREF_LP may have the same voltage value or different values.

The logical control circuit 32 transmits a switching signal between the HP mode and the LP mode and various control signals to the HP mode regulator 33 and the LP mode regulator 34.

The HP mode regulator 33 is a regulator used in the HP mode. Details thereof will be described below. The HP mode regulator 33 outputs a voltage VOUT in the HP mode.

The LP mode regulator 34 is a regulator used in the LP mode. Details thereof will be described below. The LP mode regulator 34 outputs a voltage VOUT in the LP mode. The power consumption of the LP mode regulator 34 is less than that of the HP mode regulator 33. Further, the LP mode regulator 34 has a slower response to the variation of an external load that supplies an input voltage or the output voltage VOUT than the HP mode regulator 33.

1.1.5 Configuration of HP Mode Regulator

Figure 5:
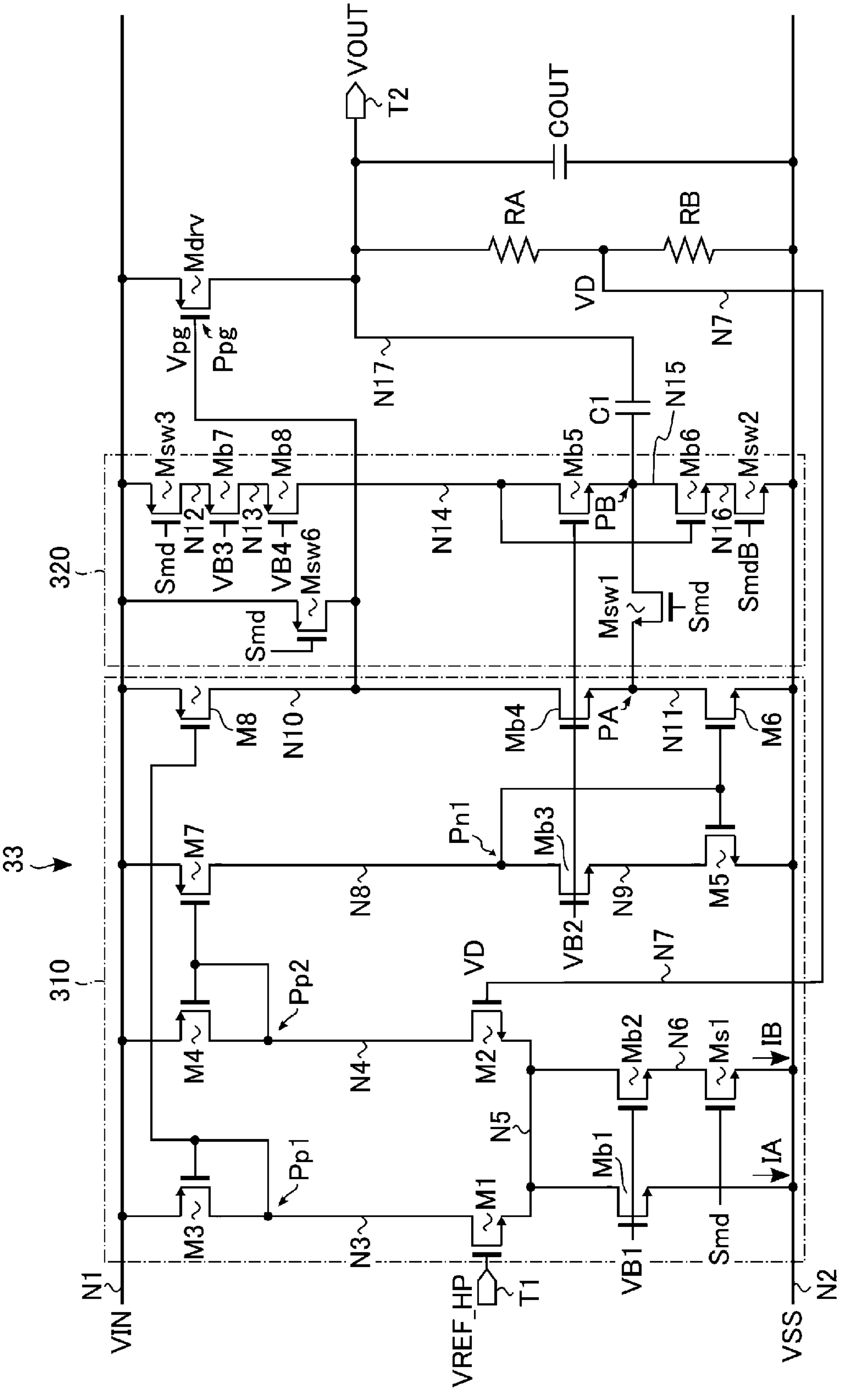
FIG. 5 is a circuit diagram of an HP mode regulator in the power supply circuit provided in the semiconductor device according to the first embodiment.

Next, an example of a configuration of the HP mode regulator 33 will be described with reference to FIG. 5. FIG. 5 is a circuit diagram illustrating an example of a configuration of the HP mode regulator 33.

In addition, in the following description, when a source and a drain of a transistor are not limited, one of the source or the drain of the transistor is referred to as "one end of the transistor", and the other one of the source and the drain of the transistor is referred to as "the other end of the transistor".

As illustrated in FIG. 5, the HP mode regulator 33 includes terminals T1 and T2, resistance elements (e.g., resistors) RA and RB, capacitor elements (e.g., capacitors) C1 and COUT, a p-channel Metal Oxide Semiconductor Field Effect Transistor (MOSFET) (hereinafter also referred to as "PMOS transistor") Mdrv, a differential amplifier circuit 310, and a mode switching circuit 320.

The terminal T1 functions as an input terminal of the differential amplifier circuit 310. The reference voltage VREF_HP is input to the terminal T1 for constant voltage control by the HP mode regulator 33.

The terminal T2 functions as an output terminal of the HP mode regulator 33. The voltage VOUT is output from the terminal T2. The terminal T2 is connected, for example, to the voltage generation circuit 15 in the memory chip 10. The terminal T2 is connected to a node N17 in the HP mode regulator 33.

The resistance elements RA and RB function as a voltage dividing circuit for the output voltage VOUT. The resistance element RA has one end connected to the node N17 and the other end connected to a node N7. The resistance element RB has one end connected to the node N7 and the other end connected to a node N2 (hereinafter also referred to as "ground voltage wiring") to which a ground voltage VSS is applied. The voltage applied to the node N7 is VD, the resistance value of the resistance element RA is rA, and the resistance value of the resistance element RB is rB. Then, a relationship between the output voltage VOUT and the voltage VD is $VD=VOUT\times(rB/(rA+rB))$.

The capacitor element COUT functions as an output condenser. The capacitor element COUT prevents the fluctuation of the output voltage VOUT due to, for example, the variation of the external load connected to the terminal T2 or the variation of a voltage VIN. The capacitor element COUT has one side electrode connected to the node N17 and the other side electrode connected to the node N2.

The capacitor element C1 is provided for phase compensation in the HP mode. The capacitor element C1 has one side electrode connected to a node N15, i.e., the mode switching circuit 320 and the other side electrode connected to the node N17. For the capacitor element C1, for example, an element having a relatively large capacitance is used for phase compensation.

The PMOS transistor Mdrv functions as an output driver of the HP mode regulator 33. In order to keep the output voltage VOUT of the HP mode regulator 33 constant, a gate voltage Vpg of the PMOS transistor Mdrv changes according to the variation of the output voltage VOUT, so that the ON-resistance of the PMOS transistor Mdrv is adjusted. The PMOS transistor Mdrv has one end connected to a node N1 (hereinafter also referred to as "power supply voltage wiring") to which the voltage VIN (e.g., the voltage VCCQ_M) is applied and the other end connected to the node N17. A gate of the PMOS transistor Mdrv is connected to the differential amplifier circuit 310 via a node N10, and the voltage Vpg is applied to the gate.

The differential amplifier circuit 310 compares the reference voltage VREF_HP with the voltage VD, and outputs the voltage Vpg depending on the difference. The differential amplifier circuit 310 includes PMOS transistors M3, M4, M7, and M8, and n-channel MOSFETs (hereinafter also referred to as "NMOS transistors") M1, M2, M5, M6, Mb1, Mb2, Mb3, Mb4, and Ms1.

The PMOS transistor M3 has one end connected to the node N1 and the other end and a gate which are connected to a node N3.

The NMOS transistor M1 has one end connected to the node N3 and the other end connected to a node N5. A gate of the NMOS transistor M1 is connected to the terminal T1, and the reference voltage VREF_HP is applied to the gate.

The PMOS transistor M4 has one end connected to the node N1, and the other end and a gate which are connected to a node N4.

The NMOS transistor M2 has one end connected to the node N4 and the other end connected to the node N5. A gate of the NMOS transistor M2 is connected to the node N7, and the voltage VD is applied to the gate.

The NMOS transistor Mb1 has one end connected to the node N5 and the other end connected to the node N2. A voltage VB1 is applied to a gate of the NMOS transistor Mb1.

The NMOS transistor Mb2 has one end connected to the node N5 and the other end connected to a node N6. The voltage VB1 is applied to a gate of the NMOS transistor Mb2.

The NMOS transistor Ms1 has one end connected to the node N6 and the other end connected to the node N2. A signal Smd is input to a gate of the NMOS transistor Ms1.

The voltage VB1 is a bias voltage for generating current IA flowing through the NMOS transistor Mb1 and current IB flowing through the NMOS transistor Mb2. The signal Smd is a signal (voltage) for switching the operation mode. The signal Smd is transmitted from the logical control circuit 32. For example, the signal Smd is set to the Low ("L") level in the LP mode and is set to the High ("H") level in the HP mode. When the signal Smd is at the "L" level, the NMOS transistor Ms1 is turned off, and when the signal Smd is at the "H" level, the NMOS transistor Ms1 is turned on. Thus, in the LP mode, the bias current IA flows through the differential amplifier circuit 310, and in the HP mode, the bias current IA+IB flows through the differential amplifier circuit 310. In addition, the transistor sizes of the NMOS transistors Mb1 and Mb2 are adjusted so that the current IA and the current IB have a relationship of IA<IB.

The PMOS transistor M7 has one end connected to the node N1, the other end connected to a node N8, and a gate connected to the node N4. That is, the PMOS transistor M7 is mirror-connected to the PMOS transistor M4.

The PMOS transistor M8 has one end connected to the node N1, the other end connected to the node N10, and a gate connected to the node N3. That is, the PMOS transistor M8 is mirror-connected to the PMOS transistor M3.

The NMOS transistor Mb3 has one end connected to the node N8 and the other end connected to a node N9. A voltage VB2 is applied to a gate of the NMOS transistor Mb3.

The NMOS transistor Mb4 has one end connected to the node N10 and the other end connected to a node N11. The voltage VB2 is applied to a gate of the NMOS transistor Mb4.

The NMOS transistor M5 has one end connected to the node N9, the other end connected to the node N2, and a gate connected to the node N8.

The NMOS transistor M6 has one end connected to the node N11, the other end connected to the node N2, and a gate connected to the node N8.

That is, the NMOS transistors Mb3, Mb4, M5, and M6 configure a cascode current mirror. The voltage VB2 is a bias voltage of the cascode current mirror.

Next, the mode switching circuit 320 will be described. Since the bias current (IA or IA+IB) in the differential amplifier circuit 310 is different between the LP mode and the HP mode, each potential in the differential amplifier circuit is different. Therefore, for example, the gate-source voltage of the NMOS transistors M1 and M2 which are differential pair transistors or the gate-source voltage of the NMOS transistor Mb4 which is a cascode device changes according to the operation mode, so that the potential of the node N11 changes. The mode switching circuit 320 generates (applies) the potential of the node N11 in the HP mode in (or to) the node N15 in advance during the LP mode, and interconnects the node N11 and the node N15 at the timing of switching from the LP mode to the HP mode. The capacitor element C1 having a relatively large capacitance is connected to the node N15. Therefore, the node N11 quickly changes to a voltage close to the voltage generated in the node N15 due to charge sharing. Thereby, as compared with a case where the mode switching circuit 320 is not used, the period from the start of switching from the LP mode to the HP mode until an operation of the HP mode is stabilized (hereinafter also referred to as "HP stabilization period") may be shortened.

The mode switching circuit 320 makes the potential of the node N15 during the LP mode basically the same as the potential of the node N11 in the HP mode. In addition, the potential of the node N15 may be lowered to a drain voltage (voltage VDS) at which the transistor M6 may operate (ON state) in the HP mode. For example, when the potential of the node N15 is set lower than the potential of the node N11 in the HP mode, the undershoot of the output voltage VOUT generated after mode switching may be improved. Similarly, when the potential of the node N15 is set higher than the potential of the node N11 in the HP mode, the overshoot of the output voltage VOUT may be improved. Therefore, the potential of the node N15 may be changed from the potential of the node N11 in the HP mode according to a required performance or the like.

For example, when the operation mode of the HP mode regulator 33 is switched from the LP mode to the HP mode, the length of the HP stabilization period may depend on the stabilization of the terminal voltage of the capacitor element C1, i.e., the charge/discharge period of the capacitor element C1. Therefore, in the LP mode, the mode switching circuit 320 according to the present embodiment generates the terminal voltage to be applied to the capacitor element C1 in the HP mode, and applies the generated voltage to the terminal of the capacitor element C1 (charges the capacitor element C1) during the LP mode. Thereby, the charge/discharge period of the capacitor element C1 is shortened.

The mode switching circuit 320 includes PMOS transistors Msw3, Mb7, Mb8, and Msw6, and NMOS transistors Msw1, Msw2, Mb5, and Mb6.

The PMOS transistor Msw3 has one end connected to the node N1 and the other end connected to a node N12. The signal Smd is input to a gate.

The PMOS transistor Mb7 has one end connected to the node N12 and the other end connected to a node N13. A voltage VB3 is applied to a gate.

The PMOS transistor Mb8 has one end connected to the node N13 and the other end connected to a node N14. A voltage VB4 is applied to a gate.

The PMOS transistor Msw6 has one end connected to the node N1 and the other end connected to the node N10. The signal Smd is input to a gate.

The NMOS transistor Mb5 has one end connected to the node N14 and the other end connected to the node N15. The voltage VB2 is applied to a gate.

The NMOS transistor Mb6 has one end connected to the node N15, the other end connected to a node N16, and a gate connected to the node N14.

The NMOS transistor Msw2 has one end connected to the node N16 and the other end connected to the node N2. A signal SmdB which is an inverted signal of the signal Smd is input to a gate.

The NMOS transistor Msw1 has one end connected to the node N11 and the other end connected to the node N15. The signal Smd is input to a gate. The NMOS transistor Msw1 functions as a switching element that disconnects the differential amplifier circuit 310 from the capacitor element C1 in the LP mode.

For example, when the HP mode regulator 33 is in the LP mode, i.e., when the signal Smd is at the "L" level and the signal SmdB is at the "H" level, the NMOS transistor Msw1 is turned off, and the NMOS transistor Msw2 and the PMOS transistors Msw3 and Msw6 are turned on. In order to generate the voltage in the HP mode in the node N15, a bias current is generated by the PMOS transistors Mb7 and Mb8, and a voltage to be applied to the capacitor element C1 in the HP mode is generated by the voltage VB2 and a voltage Vgs (gate-source voltage) of the NMOS transistor Mb5. Further, since the PMOS transistor Msw6 is turned on, the voltage VIN is applied to the gate of the PMOS transistor Mdrv. That is, the gate of the PMOS transistor Mdrv is connected to the node N1. Therefore, the PMOS transistor Mdrv is turned off. Accordingly, the HP mode regulator 33 does not operate as a regulator during the LP mode.

Further, for example, when the HP mode regulator 33 is in the HP mode, i.e., when the signal Smd is at the "H" level and the signal SmdB is at the "L" level, the NMOS transistor Msw1 is turned on, and the NMOS transistor Msw2 and the PMOS transistors Msw3 and Msw6 are turned off. Thus, the node N11 and the node N15 are electrically connected to each other. That is, the voltage of one side electrode of the capacitor element C1 is applied to the node N11. Further, since the PMOS transistor Msw6 is turned off, the voltage of the node N10 is applied to the PMOS transistor Mdrv.

The mode switching circuit 320 operates only in the LP mode, and no operating current flows therethrough in the HP mode.

In addition, in the example of FIG. 5, the bias current is generated by the PMOS transistors Mb7 and Mb8 in order to generate the voltage in the HP mode in the node N15, but the number of PMOS transistors is freely selected.

1.1.6 Configuration of LP Mode Regulator

Figure 6:
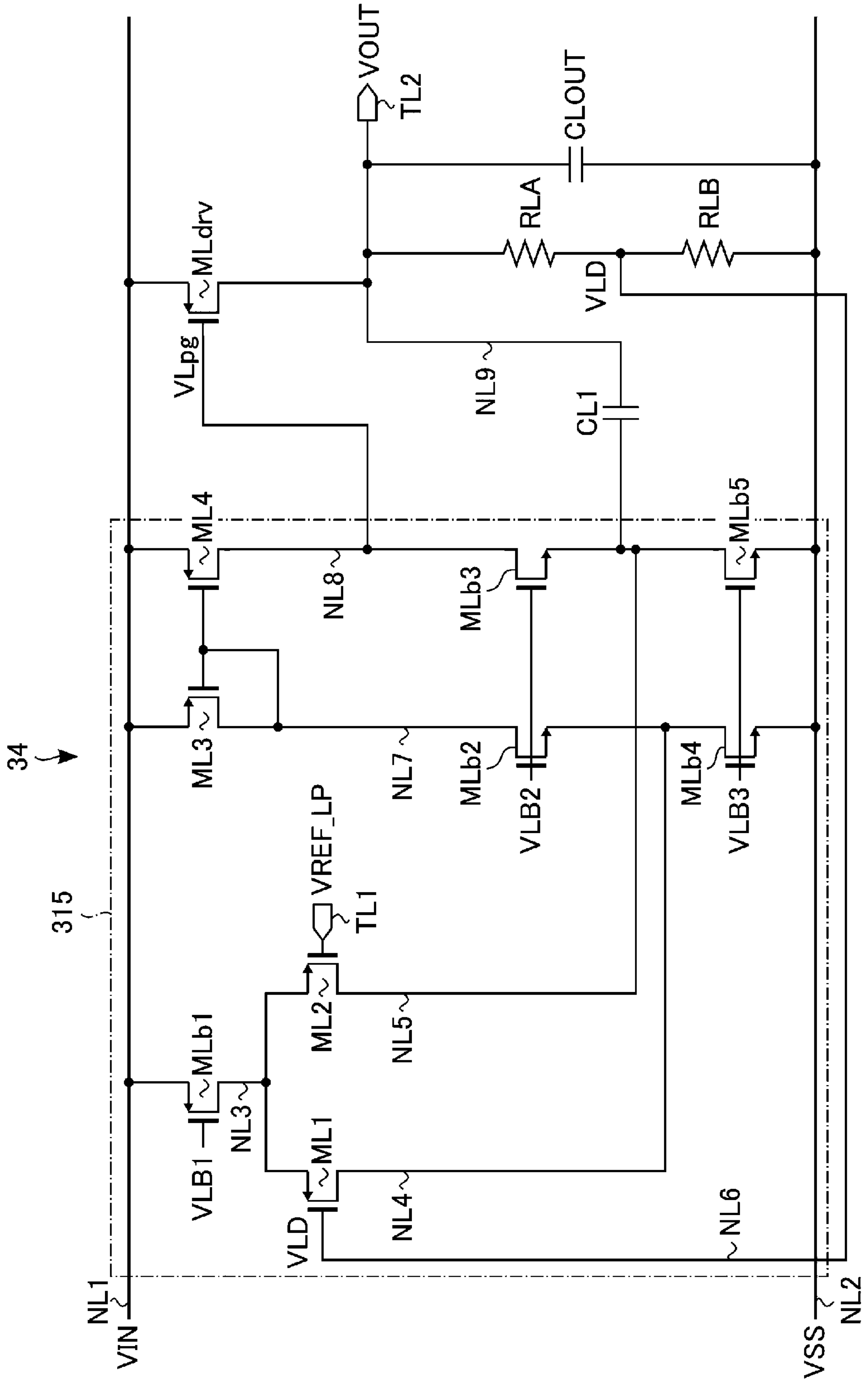
FIG. 6 is a circuit diagram of an LP mode regulator in the power supply circuit provided in the semiconductor device according to the first embodiment.

Next, an example of a configuration of the LP mode regulator 34 will be described with reference to FIG. 6. FIG. 6 is a circuit diagram illustrating an example of a configuration of the LP mode regulator 34.

As illustrated in FIG. 6, the LP mode regulator 34 includes a differential amplifier circuit 315, a PMOS transistor MLdrv, capacitor elements CL1 and CLOUT, resistance elements RLA and RLB, and terminals TL1 and TL2.

The terminal TL1 functions as an input terminal at one side of the differential amplifier circuit 315. The reference voltage VREF_LP is input to the terminal TL1 for constant voltage control by the LP mode regulator 34.

The terminal TL2 functions as an output terminal of the LP mode regulator 34. The voltage VOUT is output from the terminal TL2. The terminal TL2 is connected to a node NL9 in the LP mode regulator 34.

The PMOS transistor MLdrv functions as an output driver of the LP mode regulator 34. In order to keep the output voltage VOUT of the LP mode regulator 34 constant, a gate voltage VLpg of the PMOS transistor MLdrv changes according to the variation of the output voltage VOUT, so that the ON-resistance of the PMOS transistor MLdrv is adjusted. The PMOS transistor MLdrv has one end connected to a node NL1 (hereinafter, also referred to as "power supply voltage wiring") to which the voltage VIN (e.g., the voltage VCCQ_M) is applied and the other end connected to the node NL9. A gate of the PMOS transistor MLdrv is connected to the differential amplifier circuit 315 via a node NL8, and the voltage VLpg is applied to the gate.

The resistance elements RLA and RLB function as a voltage dividing circuit for the output voltage VOUT. The resistance element RLA has one end connected to the node NL9 and the other end connected to a node NL6. The resistance element RLB has one end connected to the node NL6 and the other end connected to a node NL2 (hereinafter also referred to as "ground voltage wiring") to which a ground voltage VSS is applied. The voltage applied to the node NL6 is VLD, the resistance value of the resistance element RLA is rLA, and the resistance value of the resistance element RLB is rLB. Then, a relationship between the output voltage VOUT and the voltage VLD is $VLD=VOUT\times(rLB/(rLA+rLB))$.

The capacitor element CLOUT functions as an output capacitor. The capacitor element CLOUT has one side electrode connected to the node NL9 and the other side electrode connected to the node NL2.

The capacitor element CL1 is provided for phase compensation of the output voltage VOUT. The capacitor element CL1 has one side electrode connected to a node NL5 and the other side electrode connected to the node NL9. For example, for the capacitor element CL1, an element having a relatively large capacitance is used for phase compensation.

The differential amplifier circuit 315 outputs a voltage VLpg depending on the difference between the reference voltage VREF and the voltage VLD. The differential amplifier circuit 315 includes PMOS transistors MLb1 and ML1 to ML4, and NMOS transistors MLb2 to MLb5.

The PMOS transistor MLb1 has one end connected to the node NL1 and the other end connected to a node NL3, and a voltage VLB1 is applied to a gate. The voltage VLB1 is a bias voltage that controls the PMOS transistor MLb1.

The PMOS transistor ML1 has one end connected to the node NL3, the other end connected to a node NL4, and a gate connected to the node NL6.

The PMOS transistor ML2 has one end connected to the node NL3 and the other end connected to the node NL5. A gate of the PMOS transistor ML2 is connected to the terminal TL1, and the reference voltage VREF_LP is applied to the gate.

The PMOS transistor ML3 has one end connected to the node NL1 and the other end and a gate which are connected to a node NL7.

The PMOS transistor ML4 has one end connected to the node NL1, the other end connected to the node NL8, and a gate connected to the node NL7. That is, the PMOS transistors ML3 and ML4 are mirror-connected to each other.

The NMOS transistor MLb2 has one end connected to the node NL7 and the other end connected to the node NL4. A voltage VLB2 is applied to a gate of the NMOS transistor MLb2.

The NMOS transistor MLb3 has one end connected to the node NL8 and the other end connected to the node NL5. The voltage VLB2 is applied to a gate of the NMOS transistor MLb3. The voltage VLB2 is a bias voltage that controls the NMOS transistors MLb2 and MLb3.

The NMOS transistor MLb4 has one end connected to the node NL4 and the other end connected to the node NL2. A voltage VLB3 is applied to a gate of the NMOS transistor MLb4.

The NMOS transistor MLb5 has one end connected to the node NL5 and the other end connected to the node NL2. The voltage VLB3 is applied to a gate of the NMOS transistor MLb5. The voltage VLB3 is a bias voltage that controls the NMOS transistors MLb4 and MLb5.

1.2 Voltage of Each Wiring of HP Mode Regulator

Figure 7:
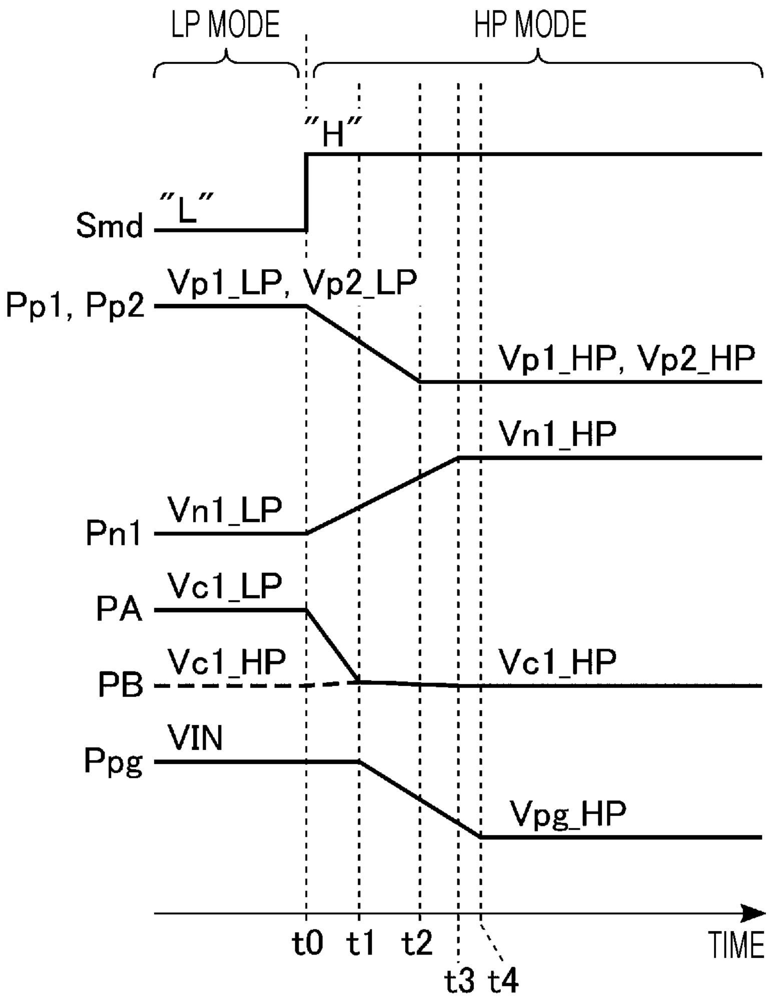
FIG. 7 is a timing chart illustrating the voltage of each wiring in the HP mode regulator in the power supply circuit provided in the semiconductor device according to the first embodiment.

Next, the voltage of each wiring of the HP mode regulator 33 will be described with reference to FIG. 7. FIG. 7 is a timing chart illustrating the voltage of each wiring of the HP mode regulator 33.

As illustrated in FIG. 7, first, at the time t0, the HP mode regulator 33 starts switching from the LP mode to the HP mode. The period from the time t0 to the time t4 corresponds to the HP stabilization period.

More specifically, at the time t0, the signal Smd that is the operation mode switching signal changes from the "L" level to the "H" level. Then, in the differential amplifier circuit 310, the bias current changes from IA to IA+IB. Thereby, the nodes N3 and N4 start discharging. At a point Pp1 of the node N3, the voltage in the LP mode is Vp1_LP and the voltage in the HP mode is Vp1_HP. Then, the voltage Vp1_LP and the voltage Vp1_HP have a relationship of Vp1_LP>Vp1_HP. Similarly, at a point Pp2 of the node N4, the voltage in the LP mode is Vp2_LP and the voltage in the HP mode is Vp2_HP. Then, the voltage Vp2_LP and the voltage Vp2_HP have a relationship of Vp2_LP>Vp2_HP. More specifically, during the period until the time t0, i.e., in the LP mode, the voltage Vp1_LP and the voltage Vp2_LP are applied to the points Pp1 and Pp2, respectively. Then, during the period from the time t0 to the time t2, the voltages at the points Pp1 and Pp2 gradually decrease, and at the time t2, the voltages at the points Pp1 and Pp2 reach the voltage Vp1_HP and the voltage Vp2_HP, respectively.

As the voltage of the node N4 decreases, the current flowing through the PMOS transistor M7 increases and the node N8 is charged. At a point Pn1 of the node N8, the voltage in the LP mode is Vn1_LP and the voltage in the HP mode is Vn1_HP. Then, the voltage Vn1_LP and the voltage Vn1_HP have a relationship of Vn1_LP<Vn1_HP. More specifically, the voltage Vn1_LP is applied to the point Pn1 during the period until the time t0. Then, during the period from the time t0 to the time t3, the voltage at the point Pn1 of the node N8 gradually increases, and at the time t3, the voltage at the point Pn1 reaches the voltage Vn1_HP.

In one side terminal connected to the node N11 of the capacitor element C1, the voltage applied in the LP mode is Vc1_LP and the voltage applied in the HP mode is Vc1_HP. Then, the voltage Vc1_LP and the voltage Vc1_HP have a relationship of Vc1_LP>Vc1_HP. During the period until the time t0, the voltage Vc1_LP is applied to a point PA of the node N11, and the voltage Vc1_HP is applied to a point PB of the node N15 of the mode switching circuit 320. Further, the mode switching circuit 320 applies the voltage Vc1_HP to the capacitor element C1. In this situation, at the time t0, in the mode switching circuit 320, the NMOS transistor Msw1 is turned on and the NMOS transistor Msw2 and the PMOS transistors Msw3 and Msw6 are turned off. Therefore, the node N11 and the node N15 are connected to each other. At this time, since the node N15 is connected to the capacitor element C1, the voltage at the point PA of the node N11 and the voltage at the point PB of the node N15 are stabilized to approximately the voltage Vc1_HP by the time t1 due to charge sharing.

At a point Ppg of the gate electrode of the PMOS transistor Mdrv connected to the node N10, the voltage Vpg in the HP mode is Vpg_HP. Then, the voltage VIN and the voltage Vpg_HP have a relationship of VIN>Vpg_HP.

At the time t1, the voltage at the point PB of the node N15 is stabilized to the voltage Vc1_HP. That is, when the source voltage of the NMOS transistor Mb4 decreases, current starts to flow from the node N10 to the node N11. Thereby, the voltage at the point Ppg of the node N10, i.e., the gate voltage Vpg of the PMOS transistor Mdrv decreases from the voltage VIN to the voltage Vpg_HP during the period from the time t1 to the time t4.

1.4 Effects of the Present Embodiment

With the configuration according to the present embodiment, it provides a semiconductor device that can improve processing capacity, as further described below.

For example, the embodiment provides a semiconductor device including a regulator having both an LP mode and an HP mode that reduces power consumption during standby. The regulator is set to the LP mode when the semiconductor device is in the standby state, and is switched to the HP mode when the semiconductor device shifts from the standby state to the active state. In order to shorten the period until the semiconductor device shifts to the active state, it is important to shorten the switching time of the regulator from the LP mode to the HP mode.

In such a regulator, phase compensation is required, and therefore, a capacitor element having a relatively large capacitance is used. The terminal voltage of the capacitor element in the LP mode and the terminal voltage of the capacitor element in the HP mode are different. Therefore, in many cases, for the length of the period for switching the operation mode, the time during which the terminal voltage of the capacitor element changes is dominant.

Meanwhile, with the configuration according to the present embodiment, the HP mode regulator 33 includes the mode switching circuit 320. The mode switching circuit 320 may apply the terminal voltage in the HP mode to the capacitor element C1 during the LP mode. Thereby, when switching from the LP mode to the HP mode, the variation of the terminal voltage of the capacitor element C1 may be prevented. A delay in the switching of the operation mode due to the variation of the terminal voltage of the capacitor element is prevented, and the stabilization period of the HP mode may be shortened. Accordingly, the processing capacity of the semiconductor device may be improved.

Moreover, when the configuration according to the present embodiment is applied to the memory system 1, the HP mode regulator 33 may be set to the LP mode when the memory chip 10 does not operate, for example, which may reduce the current consumption of the memory system 1. Moreover, in the power supply circuit 30, shifting from the LP mode to the HP mode becomes relatively fast (the HP stabilization period becomes relatively short). Therefore, the memory system 1 may shorten the period from the start of shifting from the LP mode to the HP mode until an operation in the HP mode may start. For example, the memory controller 20 may start communication with the memory chip 10 within a relatively short time after shifting to the HP mode, and the data transfer performance thereof is improved. Further, the memory controller 20 and the memory chip 10 may start a data processing within a relatively short time after shifting to the HP mode, and the data transfer performance/reliability thereof is improved. Further, since the stabilization period of the HP mode may be shortened, frequent shifting to the LP mode is possible even when the standby state is kept for a relatively short time. Accordingly, the memory system 1 may reduce power consumption.

Moreover, the memory system 1 may include a plurality of memory chips 10. The plurality of memory chips 10 are divided into a memory chip 10 that is in the access state (i.e., that is in the active state) with respect to the memory controller 20 and a memory chip 10 that is not in the access state (i.e., that is in the standby state). In such a case, the memory system 1 to which the configuration according to the present embodiment is applied may individually and rapidly switch the operation mode of each memory chip 10 according to the state. Accordingly, the memory system 1 may reduce power consumption.

2. Second Embodiment

Next, a second embodiment will be described. In the second embodiment, six examples of a configuration of the HP mode regulator 33 different from the first embodiment will be described. Hereinafter, differences from the first embodiment will be mainly described.

2.1 First Example

A first example will be described. In this example, a case where the mode switching circuit 320 is applied to the PMOS transistor Mdrv having a large gate capacitance will be described.

2.1.1 Configuration of HP Mode Regulator

Figure 8:
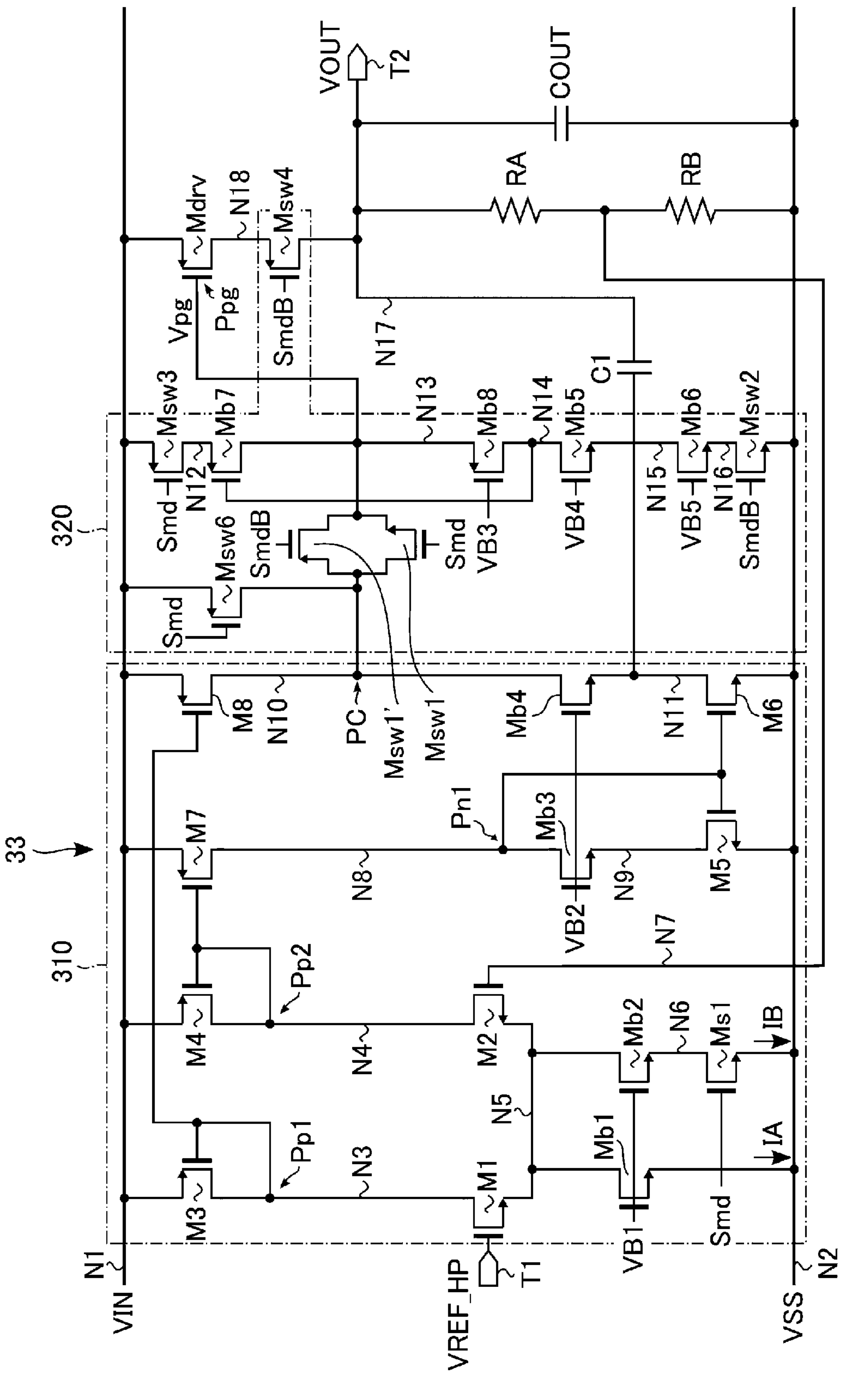
FIG. 8 is a circuit diagram of the HP mode regulator in the power supply circuit provided in the semiconductor device according to a first example of a second embodiment.

An example of a configuration of the HP mode regulator 33 according to the first example will be described with reference to FIG. 8. FIG. 8 illustrates an example of a circuit diagram of the HP mode regulator 33. The HP mode regulator 33 of this example is different from the first embodiment in the configuration of the mode switching circuit 320.

As illustrated in FIG. 8, the HP mode regulator 33 includes the terminals T1 and T2, the resistance elements RA and RB, the capacitor elements C1 and COUT, the PMOS transistor Mdrv, the differential amplifier circuit 310, and the mode switching circuit 320.

The connection sites of the terminals T1 and T2, the capacitor element COUT, and the resistance elements RA and RB are the same as in FIG. 5 of the first embodiment.

The capacitor element C1 has one side electrode connected to the node N11, i.e., the differential amplifier circuit 310 and the other side electrode connected to the node N17.

The PMOS transistor Mdrv has one end connected to the node N1 and the other end connected to a node N18. The gate of the PMOS transistor Mdrv is connected to the node N13, and the voltage Vpg is applied to the gate.

The configuration of the differential amplifier circuit 310 is the same as in FIG. 5 of the first embodiment.

The mode switching circuit 320 includes PMOS transistors Msw1', Msw3, Msw4, Mb7, Mb8, and Msw6, and NMOS transistors Msw1, Msw2, Mb5, and Mb6.

Each of the PMOS transistor Msw1' and the NMOS transistor Msw1 has one end connected to the node N10 and the other end connected to the node N13. The signal SmdB is input to a gate of the PMOS transistor Msw1'. The signal Smd is input to the gate of the NMOS transistor Msw1. The PMOS transistor Msw1' and the NMOS transistor Msw1 function as a CMOS analog switch. The gate electrode of the PMOS transistor Mdrv is separated from the differential amplifier circuit 310 in the LP mode by the PMOS transistor Msw1' and the NMOS transistor Msw1.

The PMOS transistor Msw3 has one end connected to the node N1 and the other end connected to the node N12. The signal Smd is input to the gate.

The PMOS transistor Mb7 has one end connected to the node N12, the other end connected to the node N13, and the gate connected to the node N14.

The PMOS transistor Mb8 has one end connected to the node N13 and the other end connected to the node N14. The voltage VB3 is applied to the gate.

The PMOS transistor Msw6 has one end connected to the node N1 and the other end connected to the node N10. The signal Smd is input to the gate.

The NMOS transistor Mb5 has one end connected to the node N14 and the other end connected to the node N15. A voltage VB4 is applied to the gate.

The NMOS transistor Mb6 has one end connected to the node N15 and the other end connected to the node N16. A voltage VB5 is applied to the gate.

The NMOS transistor Msw2 has one end connected to the node N16 and the other end connected to the node N2. The signal SmdB is input to the gate.

The PMOS transistor Msw4 has one end connected to the node N18 and the other end connected to the node N17. The signal SmdB is input to the gate.

For example, when the HP mode regulator 33 is in the LP mode, i.e., when the signal Smd is at the "L" level and the signal SmdB is at the "H" level, the mode switching circuit 320 applies the voltage in the HP mode to the node N13. That is, the voltage Vpg_HP in the HP mode is applied to the gate of the PMOS transistor Mdrv. Further, the mode switching circuit 320 applies the voltage VIN to the node N10.

Further, for example, when the HP mode regulator 33 is in the HP mode, i.e., when the signal Smd is at the "H" level and the signal SmdB is at the "L" level, the mode switching circuit 320 electrically interconnects the node N10 and the node N13 of the differential amplifier circuit 310. That is, the voltage of the node N10 is applied to the gate of the PMOS transistor Mdrv.

2.1.2 Voltage of Each Wiring of HP Mode Regulator

Figure 9:
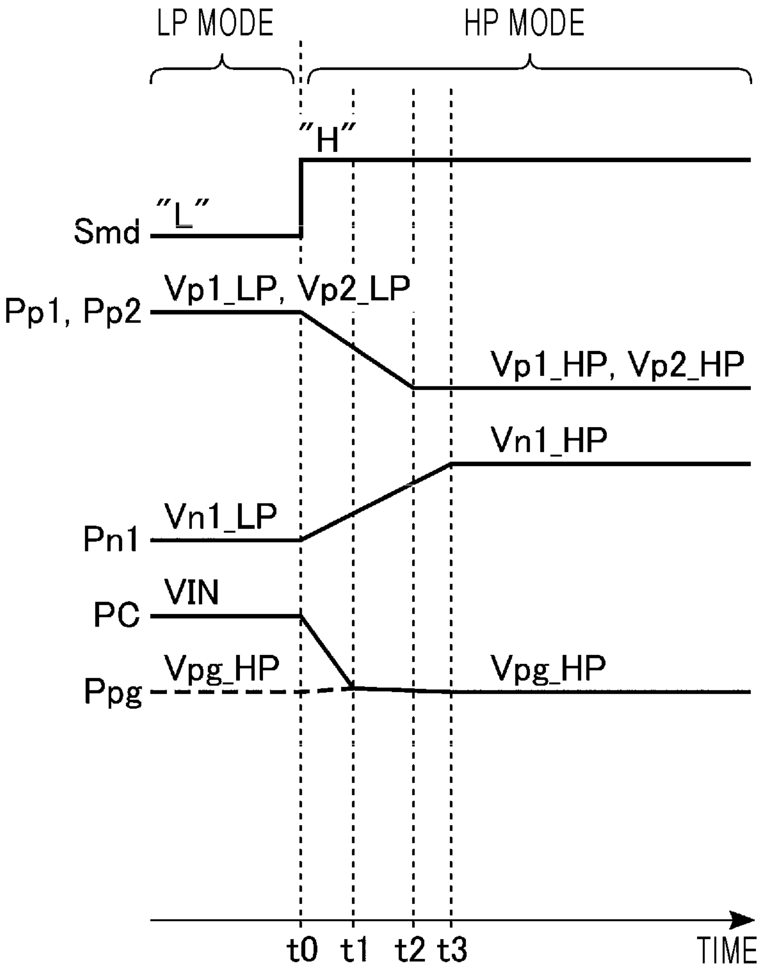
FIG. 9 is a timing chart illustrating the voltage of each wiring in the HP mode regulator in the power supply circuit provided in the semiconductor device according to the first example of the second embodiment.

Next, the voltage of each wiring of the HP mode regulator 33 will be described with reference to FIG. 9. FIG. 9 is a timing chart illustrating the voltage of each wiring of the HP mode regulator 33.

As illustrated in FIG. 9, first, at the time t0, the HP mode regulator 33 starts switching from the LP mode to the HP mode. The period from the time t0 to the time t3 corresponds to the HP stabilization period.

The signal Smd and the voltage variation at the points Pp1, Pp2, and Pn1 are the same as in FIG. 7 of the first embodiment. In this example, one side electrode of the capacitor element C1 is connected to the node N11.

During the period until the time t0, the voltage VIN is applied to a point PC of the node N10, and the voltage Vpg_HP is applied from the mode switching circuit 320 to the point Ppg. Then, when the PMOS transistor Msw1' and the NMOS transistor Msw of the mode switching circuit 320 are turned on at the time t0, the node N10 and the node N13 are connected to each other. At this time, since the node N13 is connected to the PMOS transistor Mdrv, the voltage at the point PC of the node N10 is stabilized to approximately the voltage Vpg_HP by time t1 due to charge sharing.

2.2 Second Example

Next, a second example will be described. In this example, a case where a VOUT load current circuit is added to the HP mode regulator 33 of the first example of the second embodiment will be described. Hereinafter, differences from the first example of the second embodiment will be mainly described.

2.2.1 Configuration of HP Mode Regulator

Figure 10:
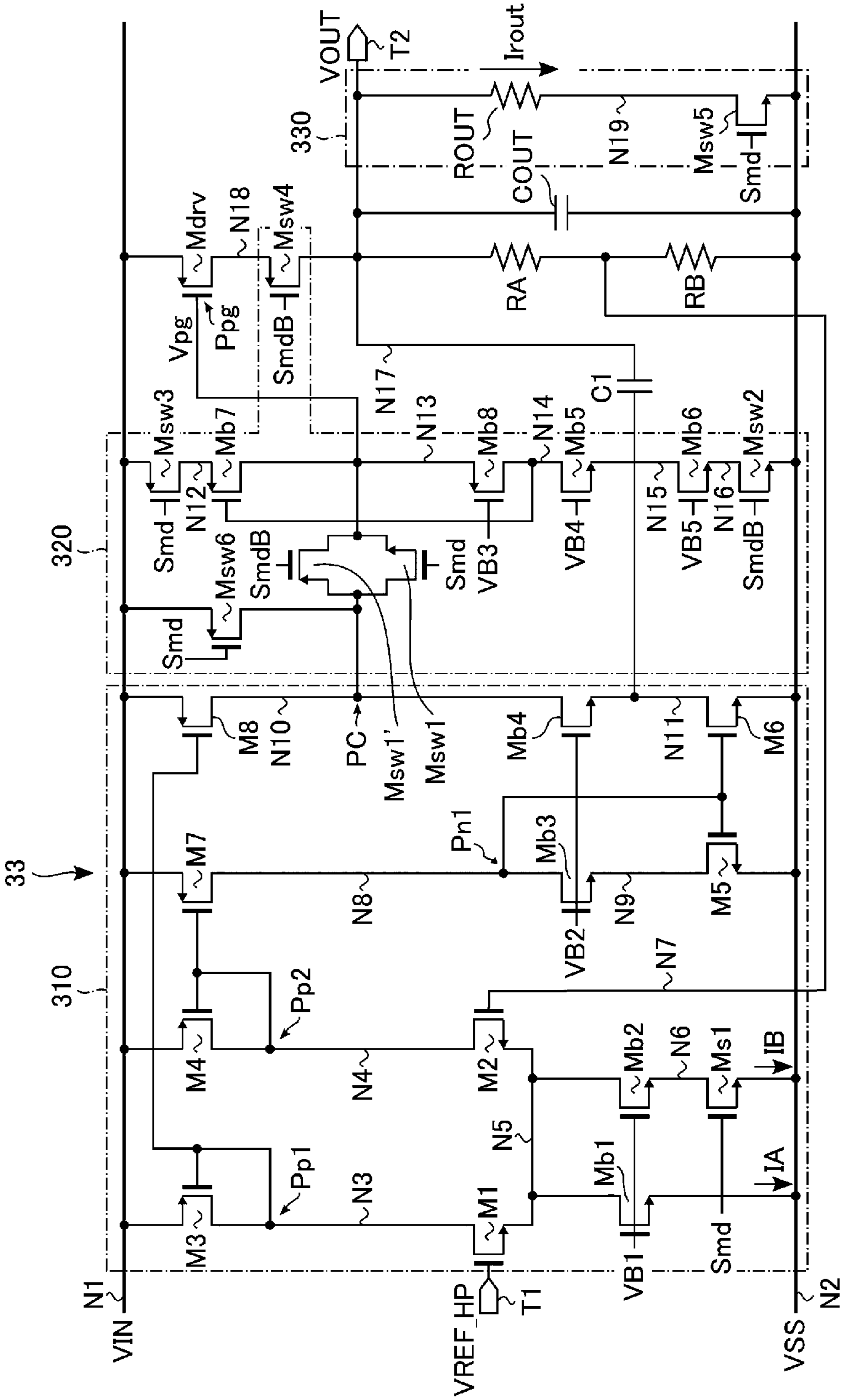
FIG. 10 is a circuit diagram of the HP mode regulator in the power supply circuit provided in the semiconductor device according to a second example of the second embodiment.

An example of a configuration of the HP mode regulator 33 according to the second example will be described with reference to FIG. 10. FIG. 10 illustrates an example of a circuit diagram of the HP mode regulator 33.

As illustrated in FIG. 10, the HP mode regulator 33 includes the terminals T1 and T2, the resistance elements RA and RB, the capacitor elements C1 and COUT, the PMOS transistor Mdrv, the differential amplifier circuit 310, the mode switching circuit 320, and a VOUT load current circuit 330.

The connections and configurations of the terminals T1 and T2, the resistance elements RA and RB, the capacitor elements C1 and COUT, the PMOS transistor Mdrv, the differential amplifier circuit 310, and the mode switching circuit 320 are the same as in FIG. 8 of the first example of the second embodiment.

For example, the load current of the output voltage VOUT may be unknown immediately after switching from the LP mode to the HP mode. The VOUT load current circuit 330 may flow preset constant current Irout therein in the HP mode. Thereby, the minimum value of the load current of the output voltage VOUT may be set.

The VOUT load current circuit 330 sets the minimum value of the load current and the load current range at the terminal T2. The VOUT load current circuit 330 includes a resistance element ROUT and an NMOS transistor Msw5.

The resistance element ROUT has one end connected to the node N17 and the other end connected to a node N19.

The NMOS transistor Msw5 has one end connected to the node N19 and the other end connected to the node N2. The signal Smd is input to a gate of the NMOS transistor Msw5.

The NMOS transistor Msw5 of the VOUT load current circuit 330 is turned off in the LP mode and is turned on in the HP mode. Therefore, assuming that the resistance value of the resistance element ROUT is rOUT, constant current Irout (=VOUT/rOUT) flows from the node N17 to the node N2 during the HP mode.

2.2.2 Voltage and Current of Each Wiring of HP Mode Regulator

Figure 11:
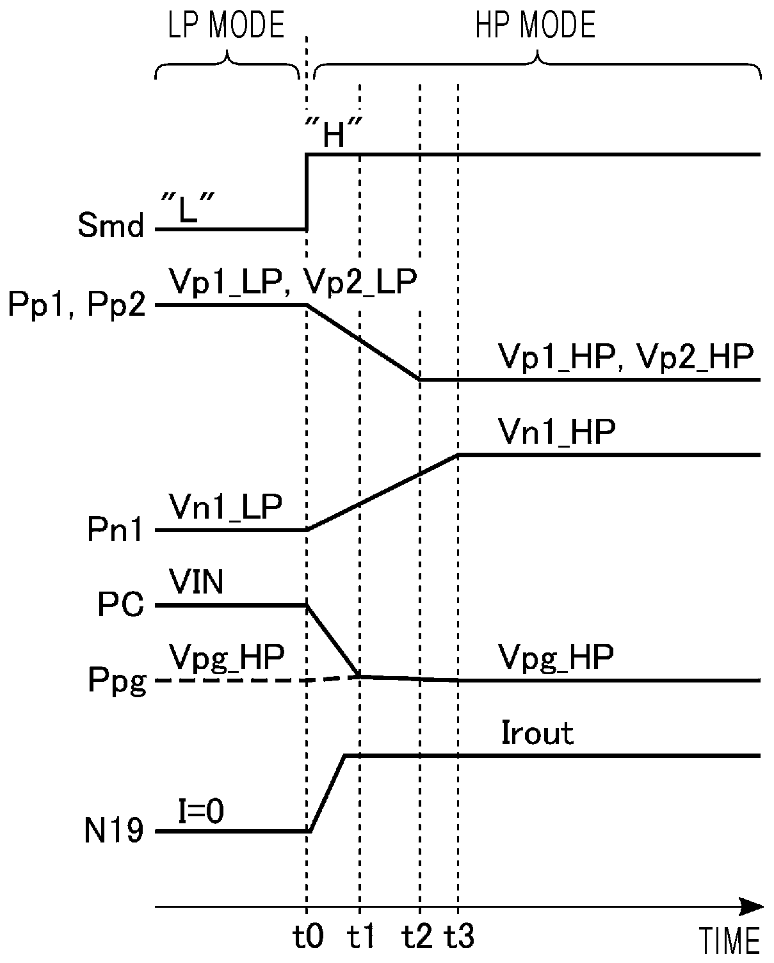
FIG. 11 is a timing chart illustrating the voltage of each wiring in the HP mode regulator in the power supply circuit provided in the semiconductor device according to the second example of the second embodiment.

Next, the voltage and current of each wiring of the HP mode regulator 33 will be described with reference to FIG. 11. FIG. 11 is a timing chart illustrating the voltage and current of each wiring of the HP mode regulator 33.

As illustrated in FIG. 11, first, at the time t0, the HP mode regulator 33 starts switching from the LP mode to the HP mode. The period from the time t0 to the time t3 corresponds to the HP stabilization period.

The signal Smd and the voltage variation at the points Pp1, Pp2, Pn1, PC, and Ppg are the same as in FIG. 9 of the first example of the second embodiment.

During the period until the time t0, the NMOS transistor Msw5 is in the off state, so that no current flows to the node N19 of the VOUT load current circuit 330. Then, when the NMOS transistor Msw5 is turned on at the time t0, the current Irout flows to the node N19 of the VOUT load current circuit 330.

2.3 Third Example

Next, a third example will be described. In this example, a case where a phase compensation circuit 340 is added to the HP mode regulator 33 of the first example of the second embodiment will be described. Hereinafter, differences from the first example of the second embodiment will be mainly described.

2.3.1 Configuration of HP Mode Regulator

Figure 12:
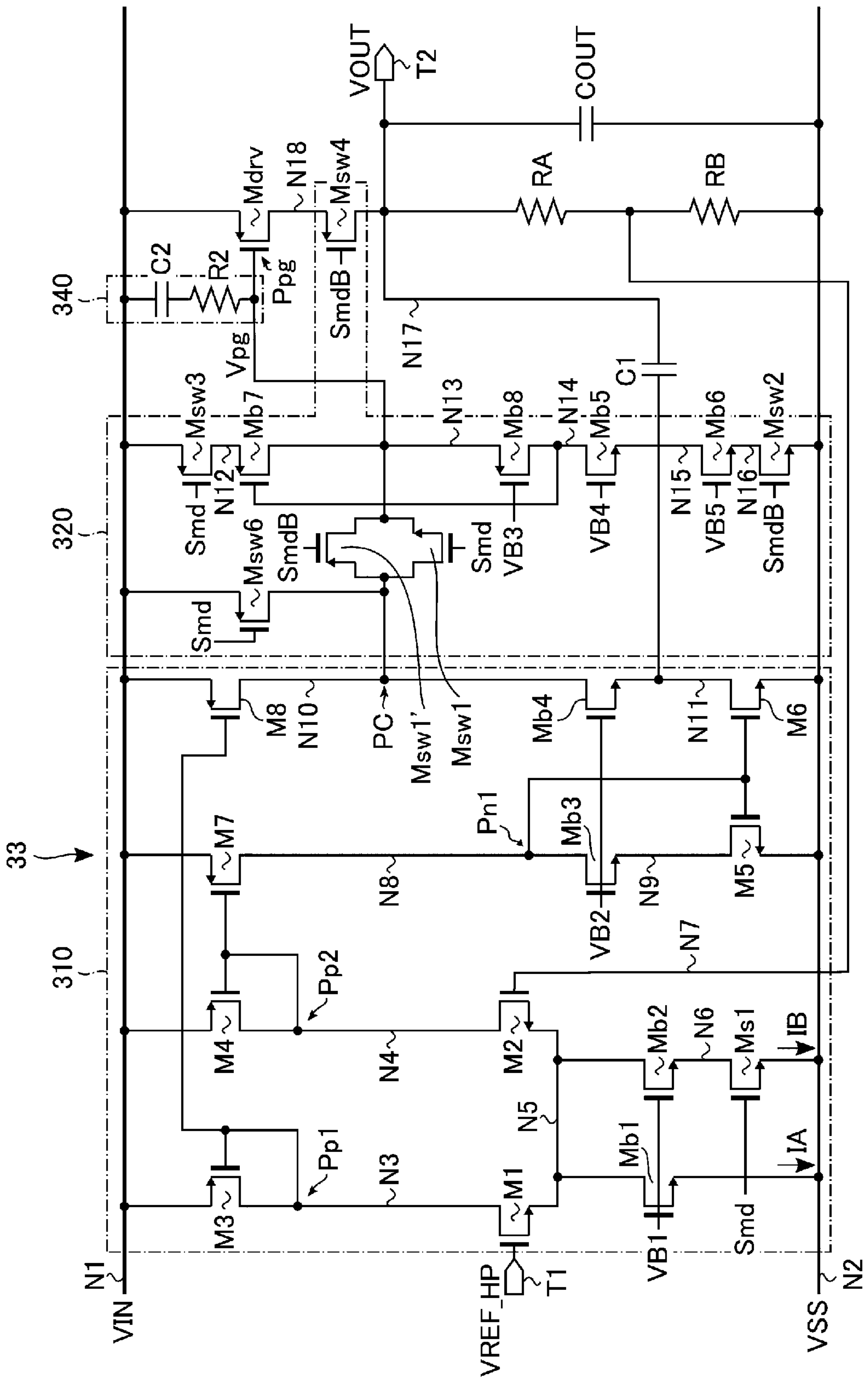
FIG. 12 is a circuit diagram of the HP mode regulator in the power supply circuit provided in the semiconductor device according to a third example of the second embodiment.

An example of a configuration of the HP mode regulator 33 according to the third example will be described with reference to FIG. 12. FIG. 12 illustrates an example of a circuit diagram of the HP mode regulator 33.

As illustrated in FIG. 12, the HP mode regulator 33 includes the terminals T1 and T2, the resistance elements RA and RB, the capacitor elements C1 and COUT, the PMOS transistor Mdrv, the differential amplifier circuit 310, the mode switching circuit 320, and the phase compensation circuit 340.

The connections and configurations of the terminals T1 and T2, the resistance elements RA and RB, the capacitor elements C1 and COUT, the PMOS transistor Mdrv, the differential amplifier circuit 310, and the mode switching circuit 320 are the same as in FIG. 8 of the first example of the second embodiment.

The phase compensation circuit 340 is provided as phase compensation for the gate of the PMOS transistor Mdrv. The phase compensation circuit 340 includes a capacitor element C2 and a resistance element R2.

The phase compensation circuit 340 interconnects the node N1 and the node N13 in the vicinity of the PMOS transistor Mdrv. More specifically, the capacitor element C2 has one side electrode connected to the node N1 and the other side electrode connected to one end of the resistance element R2. The other end of the resistance element R2 is connected to the node N13.

Accordingly, the phase compensation circuit 340 is connected between an analog switch implemented by the PMOS transistor Msw1' and the NMOS transistor Msw1 of the mode switching circuit 320 and the PMOS transistor Mdrv.

In addition, the voltage of each wiring of the HP mode regulator 33 in this example is the same as in FIG. 9 of the first example of the second embodiment.

2.4 Fourth Example

Next, a fourth example will be described. In this example, a configuration of the HP mode regulator 33 when the capacitance of the capacitor element C2 of the phase compensation circuit 340 of the third example of the second embodiment is greater than the gate capacitance of the PMOS transistor Mdrv will be described. Hereinafter, differences from the third example of the second embodiment will be mainly described.

2.4.1 Configuration of HP Mode Regulator

Figure 13:
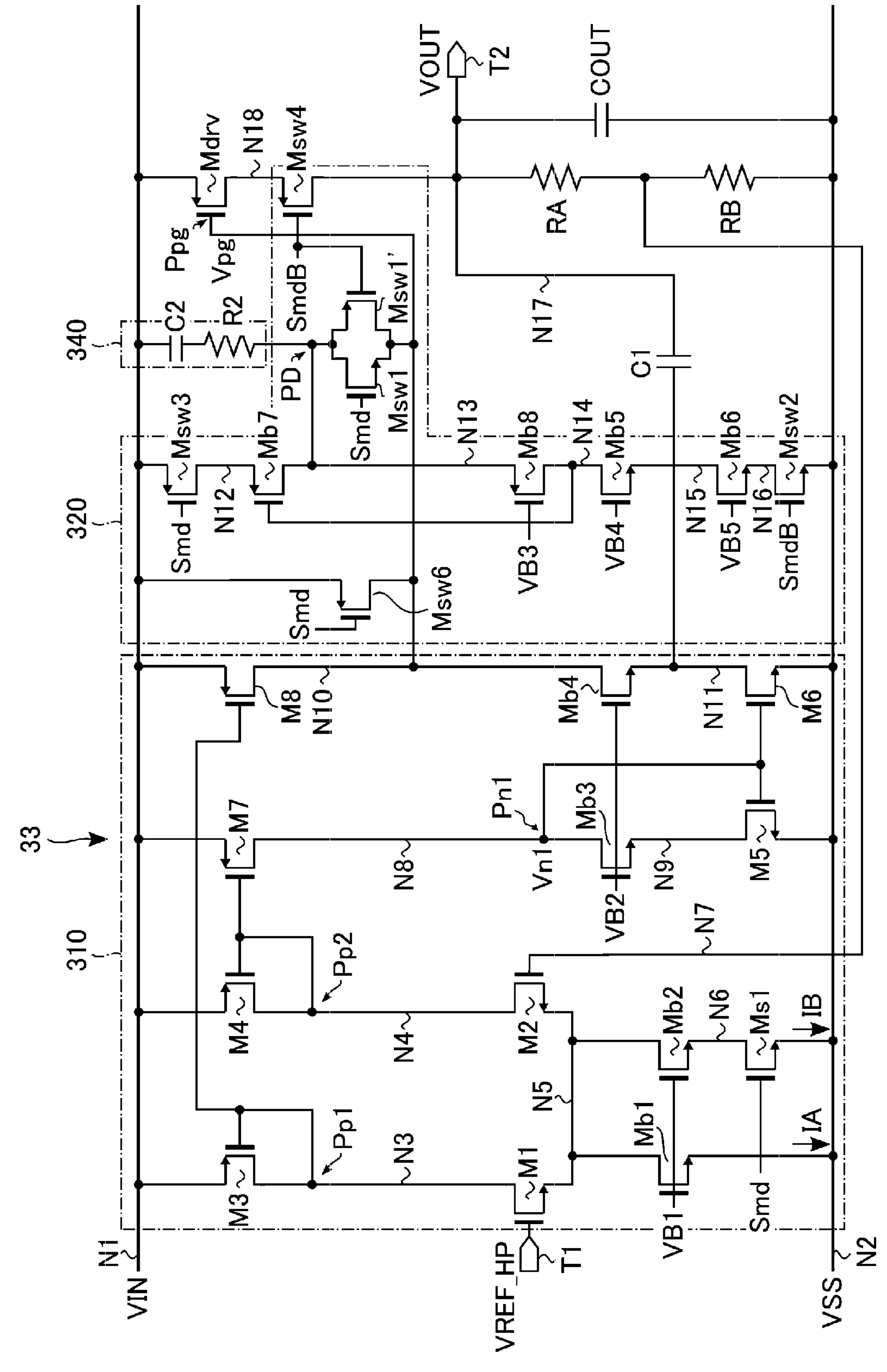
FIG. 13 is a circuit diagram of the HP mode regulator in the power supply circuit provided in the semiconductor device according to a fourth example of the second embodiment.

An example of a configuration of the HP mode regulator 33 according to the fourth example will be described with reference to FIG. 13. FIG. 13 illustrates an example of a circuit diagram of the HP mode regulator 33.

As illustrated in FIG. 13, the HP mode regulator 33 includes the terminals T1 and T2, the resistance elements RA and RB, the capacitor elements C1 and COUT, the PMOS transistor Mdrv, the differential amplifier circuit 310, the mode switching circuit 320, and the phase compensation circuit 340.

The connections and configurations of the terminals T1 and T2, the resistance elements RA and RB, the capacitor elements C1 and COUT, the differential amplifier circuit 310, the mode switching circuit 320, and the phase compensation circuit 340 are the same as in the third example of the second embodiment.

The PMOS transistor Mdrv has one end connected to the node N1 and the other end connected to the node N18. The gate of the PMOS transistor Mdrv is connected to the node N10, and the voltage Vpg is applied to the gate.

In this example, an analog switch implemented by the PMOS transistor Msw1' and the NMOS transistor Msw1 of the mode switching circuit 320 is disposed between the phase compensation circuit 340 and the PMOS transistor Mdrv.

2.4.2 Voltage of Each Wiring of HP Mode Regulator

Figure 14:
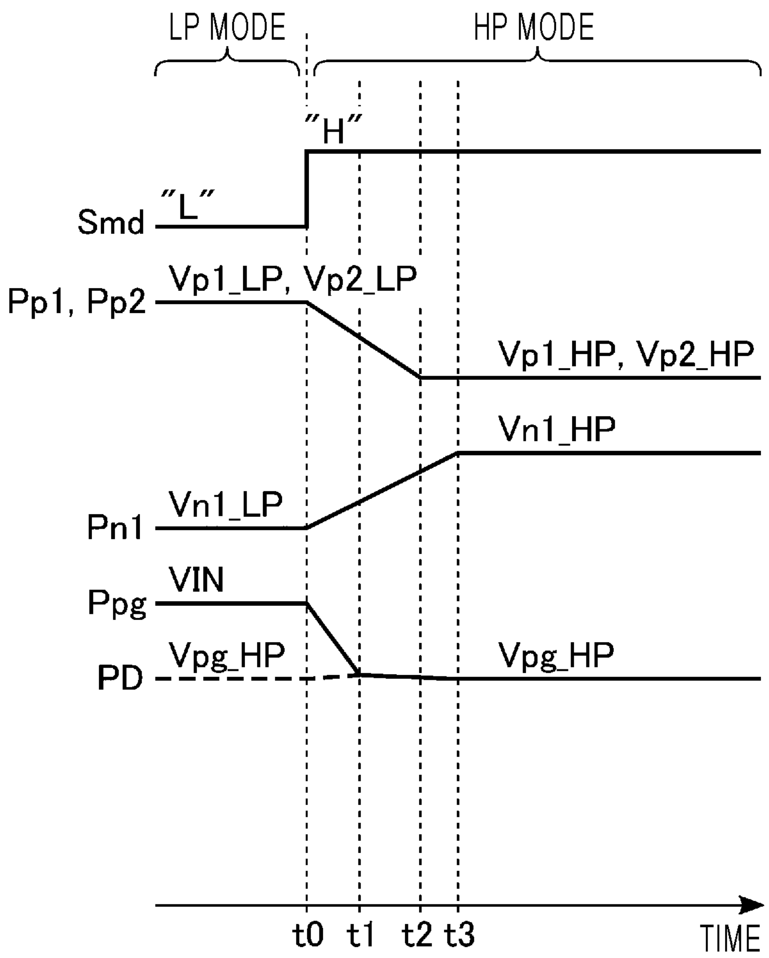
FIG. 14 is a timing chart illustrating the voltage of each wiring in the HP mode regulator in the power supply circuit provided in the semiconductor device according to the fourth example of the second embodiment.

Next, the voltage of each wiring of the HP mode regulator 33 will be described with reference to FIG. 14. FIG. 14 is a timing chart illustrating the voltage of each wiring of the HP mode regulator 33.

As illustrated in FIG. 14, first, at the time t0, the HP mode regulator 33 starts switching from the LP mode to the HP mode. The period from the time t0 to the time t3 corresponds to the HP stabilization period.

The signal Smd and the voltage variation at the points Pp1, Pp2, and Pn1 are the same as in FIG. 9 of the first example of the second embodiment.

During the period until the time t0, the voltage Vpg_HP is applied to a point PD of the node N13. Then, when the PMOS transistor Msw1' and the NMOS transistor Msw of the mode switching circuit 320 are turned on at the time t0, the node N10 and the node N13 are connected to each other. At this time, since the node N13 is connected to the capacitor element C2, the voltage at the point Ppg is stabilized to approximately the voltage Vpg_HP by time t1 due to the charge sharing.

2.5 Fifth Example

Next, a fifth example will be described. In this example, a case where a boost circuit 350 is added to the HP mode regulator 33 of the first embodiment will be described.

2.5.1 Configuration of HP Mode Regulator

Figure 15:
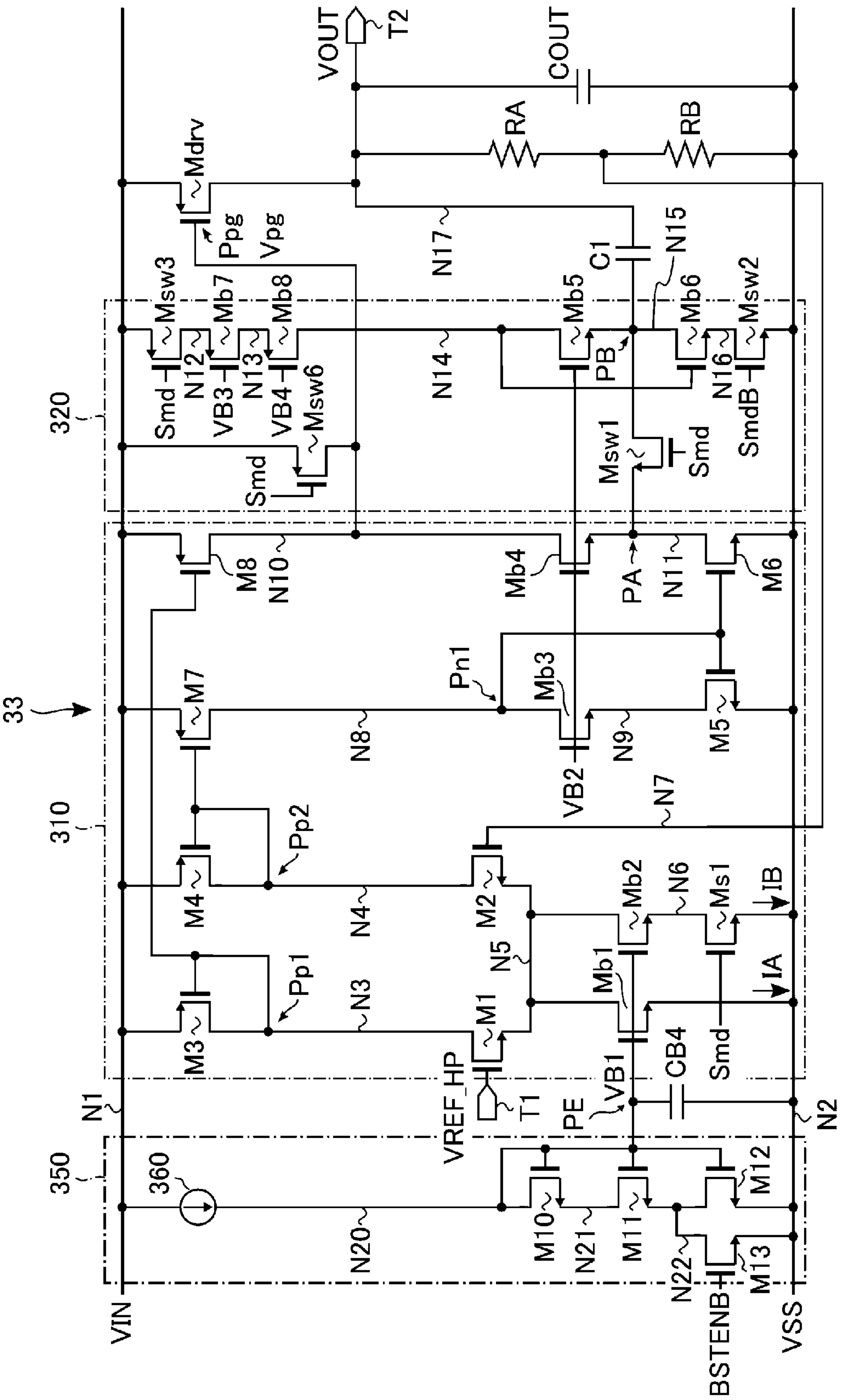
FIG. 15 is a circuit diagram of the HP mode regulator in the power supply circuit provided in the semiconductor device according to a fifth example of the second embodiment.

An example of a configuration of the HP mode regulator 33 according to the fifth example will be described with reference to FIG. 15. FIG. 15 illustrates an example of a circuit diagram of the HP mode regulator 33.

As illustrated in FIG. 15, the HP mode regulator 33 includes the terminals T1 and T2, the resistance elements RA and RB, the capacitor elements C1, COUT, a capacitor element CB4, the PMOS transistor Mdrv, the differential amplifier circuit 310, the mode switching circuit 320, and the boost circuit 350.

The connections and configurations of the terminals T1 and T2, the resistance elements RA and RB, the capacitor elements C1 and COUT, the differential amplifier circuit 310, and the mode switching circuit 320 are the same as in FIG. 5 of the first embodiment.

The capacitor element CB4 has one side electrode connected to a node N20 and the other side electrode connected to the node N2. The capacitor element CB4 is provided in order to make the voltage variation at a point PE of the node N20 relatively gentle by the charge and discharge of the capacitor element CB4.

The boost circuit 350 boosts the bias current IA+IB flowing through the differential amplifier circuit 310 within a relatively short period immediately after the HP mode regulator 33 is switched from the LP mode to the HP mode in order to shorten the HP stabilization period.

The boost circuit 350 includes a current source 360 and NMOS transistors M10 to M13.

The current source 360 has an input terminal connected to the node N1 and an output terminal connected to the node N20.

The NMOS transistor M10 has one end and a gate which are connected to the node N20 and the other end connected to a node N21. The node N20 is connected to the gates of the NMOS transistors Mb1 and Mb2 in the differential amplifier circuit 310. That is, the bias voltage VB1 is applied to the gates of the NMOS transistors Mb1 and Mb2 via the node N20.

The NMOS transistor M11 has one end connected to the node N21, the other end connected to a node N22, and a gate connected to the node N20.

The NMOS transistor M12 has one end connected to the node N22, the other end connected to the node N2, and a gate connected to the node N20.

The NMOS transistor M13 has one end connected to the node N22 and the other end connected to the node N2. A signal BSTENB is applied to a gate of the NMOS transistor M13. The signal BSTENB is a signal for boost controlling the bias current IA+IB. For example, the signal BSTENB is set to the "L" level while boosting the bias current IA+IB in the HP mode, and is switched from the "L" level to the "H" level when the boost of the bias current IA+IB ends.

The signal BSTENB is transmitted from, for example, the logical control circuit 32.

2.5.2 Voltage and Current of Each Wiring of HP Mode Regulator

Figure 16:
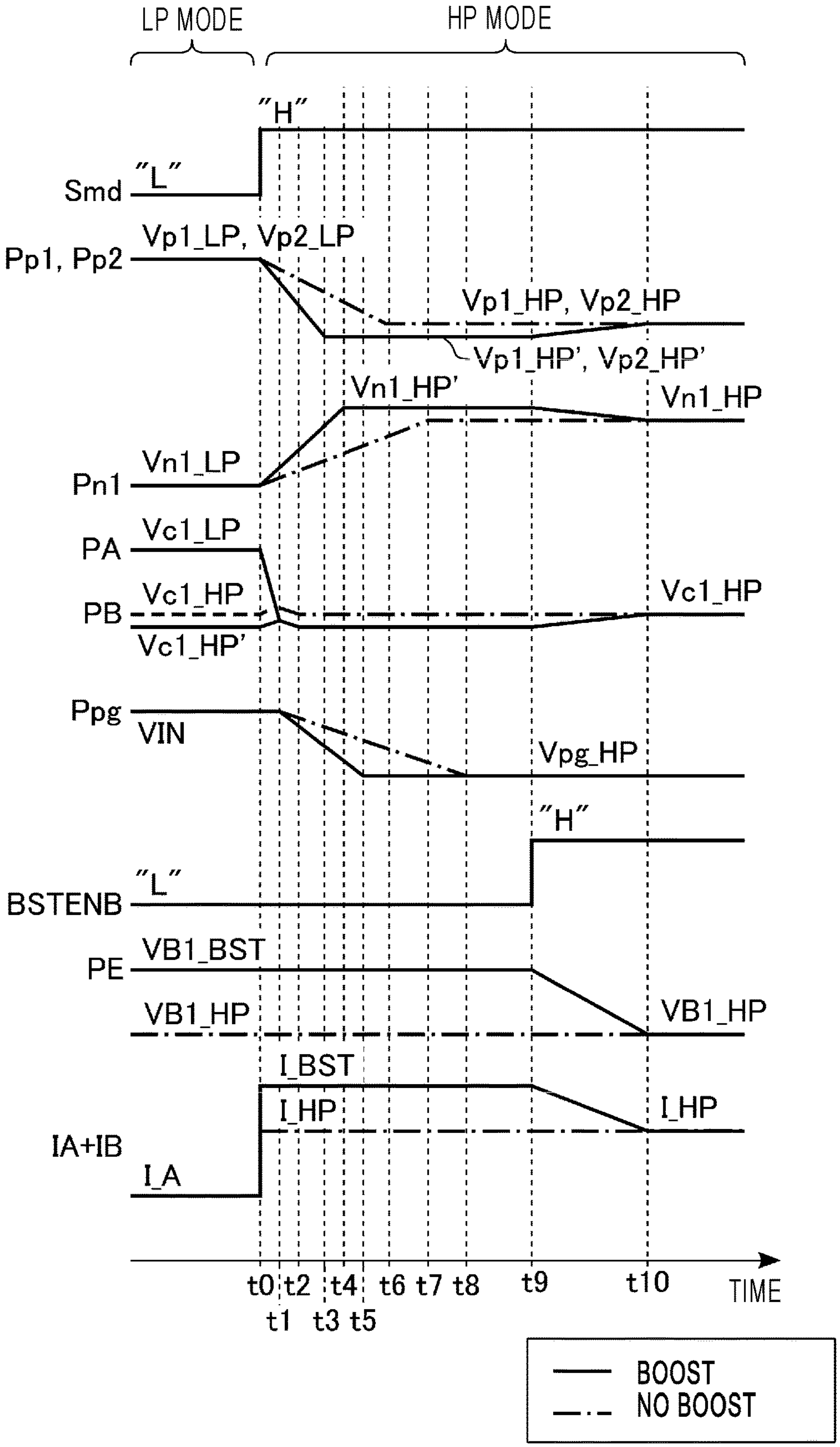
FIG. 16 is a timing chart illustrating the voltage and current of each wiring in the HP mode regulator in the power supply circuit provided in the semiconductor device according to the fifth example of the second embodiment.

Next, the voltage and current of each wiring of the HP mode regulator 33 will be described with reference to FIG. 16. FIG. 16 is a timing chart illustrating the voltage and current of each wiring of the HP mode regulator 33. In the example of FIG. 16, a case where there is boost of the bias current IA+IB by the boost circuit 350 is represented by a solid line, and a case where there is no boost (i.e., a case of showing the same behavior as in the first embodiment) is represented by a dashed line.

As illustrated in FIG. 16, first, at the time t0, the HP mode regulator 33 starts switching from the LP mode to the HP mode. In this example, the period from time the t0 to the time t5 corresponds to the HP stabilization period.

For example, during the period until the time t0, i.e., in the LP mode, the signal BSTENB is set to the "L" level. In this case, the boost circuit 350 is in the boost state. At the point PE of the node N20, the voltage VB1 when the boost circuit 350 is in the boost state is VB1_BST, and the voltage VB1 when the boost circuit 350 is in the non-boost state (normal state in the HP mode) is VB1 HP. Then, the voltage VB1_BST and the voltage VB1 HP have a relationship of VB1_BST>VB1 HP. Accordingly, the voltage VB1_BST is applied to the point PE during the LP mode.

However, because the signal Smd is at the "L" level during the LP mode, the NMOS transistor Ms1 of the differential amplifier circuit 310 is turned off. Therefore, the bias current IA (boosted bias current IA) flows through the differential amplifier circuit 310. In addition, the signal BSTENB may be set to the "H" level during the LP mode.

When the signal Smd is set to the "H" level at the time t0, the NMOS transistor Ms1 of the differential amplifier circuit 310 is turned on. Therefore, the differential amplifier circuit 310 boosts the bias current IA+IB. The bias current IA+IB in the boost state is expressed as I_BST, and the bias current IA+IB in the normal state in the HP mode is expressed as I_HP. Then, the current I_BST and the current I_HP have a relationship of I_BST>I_HP. When the signal Smd is set to the "H" level, the bias current I_BST flows through the differential amplifier circuit 310.

When the bias current I_BST flows through the differential amplifier circuit 310, the period until the voltage Vpg is stabilized is shortened. That is, the HP stabilization period is shortened.

For example, the voltages at the points Pp1 and Pp2 change respectively from the voltage Vp1_LP and the voltage Vp2_LP to the voltage Vp1_HP and the voltage Vp2_HP during the period from the time t0 to the time t6 when there is no boost. Meanwhile, when there is boost, the voltages at the points Pp1 and Pp2 change respectively from the voltage Vp1_LP and the voltage Vp2_LP to a voltage Vp1_HP' and a voltage Vp2_HP' which are slightly lower than the voltage Vp1_HP and the voltage Vp2_HP during the period from the time t0 to the time t3, and is stable during the period from the time t3 to the time t9. Then, when shifting from the boost state to the non-boost state during the period from the time t9 to the time t10, the voltages Vp1_HP' and the voltage Vp2_HP' at the points Pp1 and Pp2 change to the voltage Vp1_HP and the voltage Vp2_HP, respectively.

For example, the voltage at the point Pn1 changes from the voltage Vn1_LP to the voltage Vn1_HP during the period from the time t0 to the time t7 when there is no boost. Meanwhile, when there is boost, the voltage at the point Pn1 changes from the voltage Vn1_LP to a voltage Vn1_HP' which is slightly higher than the voltage Vn1_HP during the period from the time t0 to the time t4, and is stable during the period from the time t4 to the time t9. Then, when shifting from the boost state to the non-boost state during the period from the time t9 to the time t10, the voltage Vn1_HP' at the point Pn1 changes to the voltage Vn1_HP.

For example, when there is no boost, the voltages at the points PA and PB are stabilized to the voltage Vc1_HP at the time t2 after charge sharing. Meanwhile, when there is boost, the voltages at the points PA and PB are stabilized to a voltage Vc1_HP' which is slightly lower than the voltage Vc1_HP at the time t2 after charge sharing. Then, when shifting from the boost state to the non-boost state during the period from the time t9 to the time t10, the voltage Vc1_HP' at the points PA and PB changes to the voltage Vc1_HP.

For example, the voltage at the point Ppg changes from the voltage Vpg_LP to the voltage Vpg_HP during the period from the time t1 to the time t8 when there is no boost. Meanwhile, when there is boost, the voltage at the point Ppg changes from the voltage Vpg_LP to the voltage Vpg_HP during the period from the time t1 to the time t5.

The signal BSTENB is switched from the "L" level to the "H" level at the time t9 after, for example, the voltages at the points Pp1, Pp2, Pn1, PA, PB, and Ppg are stabilized. Thereby, the boost circuit 350 ends the boost state. Therefore, the voltage at the point PE changes from the voltage VB1_BST to the voltage VB1 HP during the period from the time t9 to the time t10. At this time, the voltage at the point PE decreases relatively gently due to the influence of the capacitor element CB4. Similarly, the bias current IA+IB also decreases relatively gently (smoothly) from the current I_BST to the current I_HP during the period from the time t9 to the time t10. By changing the amount of bias current gently, it is possible to follow each potential of the HP mode regulator 33. Therefore, the HP mode regulator 33 may switch the bias current IA+IB in the normal operation state of the HP mode.

2.6 Sixth Example

Next, a sixth example will be described. In this example, a case where the boost circuit 350 described in the fifth example of the second embodiment is applied to the VOUT load current circuit 330 will be described. Hereinafter, differences from the second example and the fifth example of the second embodiment will be mainly described.

2.6.1 Configuration of HP Mode Regulator

Figure 17:
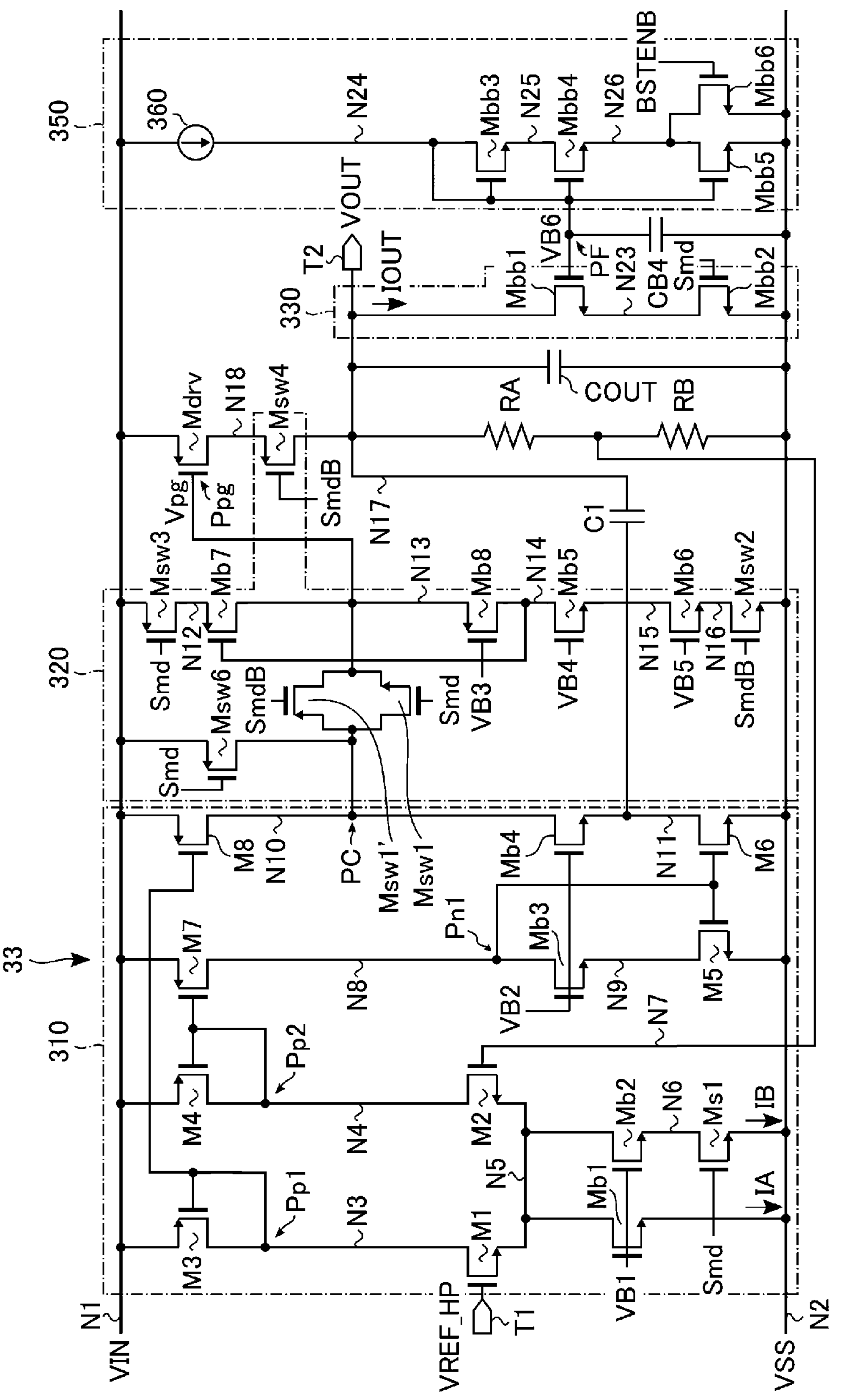
FIG. 17 is a circuit diagram of the HP mode regulator in the power supply circuit provided in the semiconductor device according to a sixth example of the second embodiment.

An example of a configuration of the HP mode regulator 33 according to the sixth example will be described with reference to FIG. 17. FIG. 17 illustrates an example of a circuit diagram of the HP mode regulator 33.

As illustrated in FIG. 17, the HP mode regulator 33 includes the terminals T1 and T2, the resistance elements RA and RB, the capacitor elements C1, COUT, and CB4, the PMOS transistor Mdrv, the differential amplifier circuit 310, the mode switching circuit 320, and the VOUT load current circuit 330, and the boost circuit 350.

The connections and configurations of the terminals T1 and T2, the resistance elements RA and RB, the capacitor elements C1 and COUT, the PMOS transistor Mdrv, the differential amplifier circuit 310, and the mode switching circuit 320 are the same as in the second example of the second embodiment illustrated in FIG. 10.

The capacitor element CB4 of this example has one side electrode connected to a node N24 and the other side electrode connected to the node N2.

The VOUT load current circuit 330 of this example includes NMOS transistors Mbb1 and Mbb2.

The NMOS transistor Mbb1 has one end connected to the node N17 and the other end connected to a node N23. A bias voltage VB6 generated by the boost circuit 350 is applied to a gate of the NMOS transistor Mbb1.

The NMOS transistor Mbb2 has one end connected to the node N23 and the other end connected to the node N2. The signal Smd is input to the gate of the NMOS transistor Mbb2. For example, when the signal Smd is at the "L" level, i.e., in the LP mode, the NMOS transistor Mbb2 is turned off. Therefore, output current IOUT does not flow through the VOUT load current circuit 330.

To shorten the HP stabilization period, the boost circuit 350 of this example boosts the voltage VB6 to be applied to the VOUT load current circuit 330 within a relatively short period immediately after the HP mode regulator 33 is switched from the LP mode to the HP mode.

The boost circuit 350 includes the current source 360 and NMOS transistors Mbb3 to Mbb6. The configurations of the NMOS transistors Mbb3 to Mbb6 are the same as the NMOS transistors M10 to M13 of the boost circuit 350 described in FIG. 15 of the fifth example of the second embodiment.

More specifically, the current source 360 has an input terminal connected to the node N1 and an output terminal connected to the node N24.

The NMOS transistor Mbb3 has one end and a gate which are connected to the node N24 and the other end connected to a node N25.

The NMOS transistor Mbb4 has one end connected to the node N25, the other end connected to a node N26, and a gate connected to the node N24.

The NMOS transistor Mbb5 has one end connected to the node N26, the other end connected to the node N2, and a gate connected to the node N24.

The NMOS transistor Mbb6 has one end connected to the node N26 and the other end connected to the node N2. The signal BSTENB is applied to a gate of the NMOS transistor Mbb6. The signal BSTENB is a signal for boost controlling the bias voltage VB6. For example, the signal BSTENB is set to the "L" level in the HP mode while boosting the bias voltage VB6, and is switched from the "L" level to the "H" level when ending the boost of the output current IOUT.

2.6.2 Voltage and Current of Each Wiring of HP Mode Regulator

Figure 18:
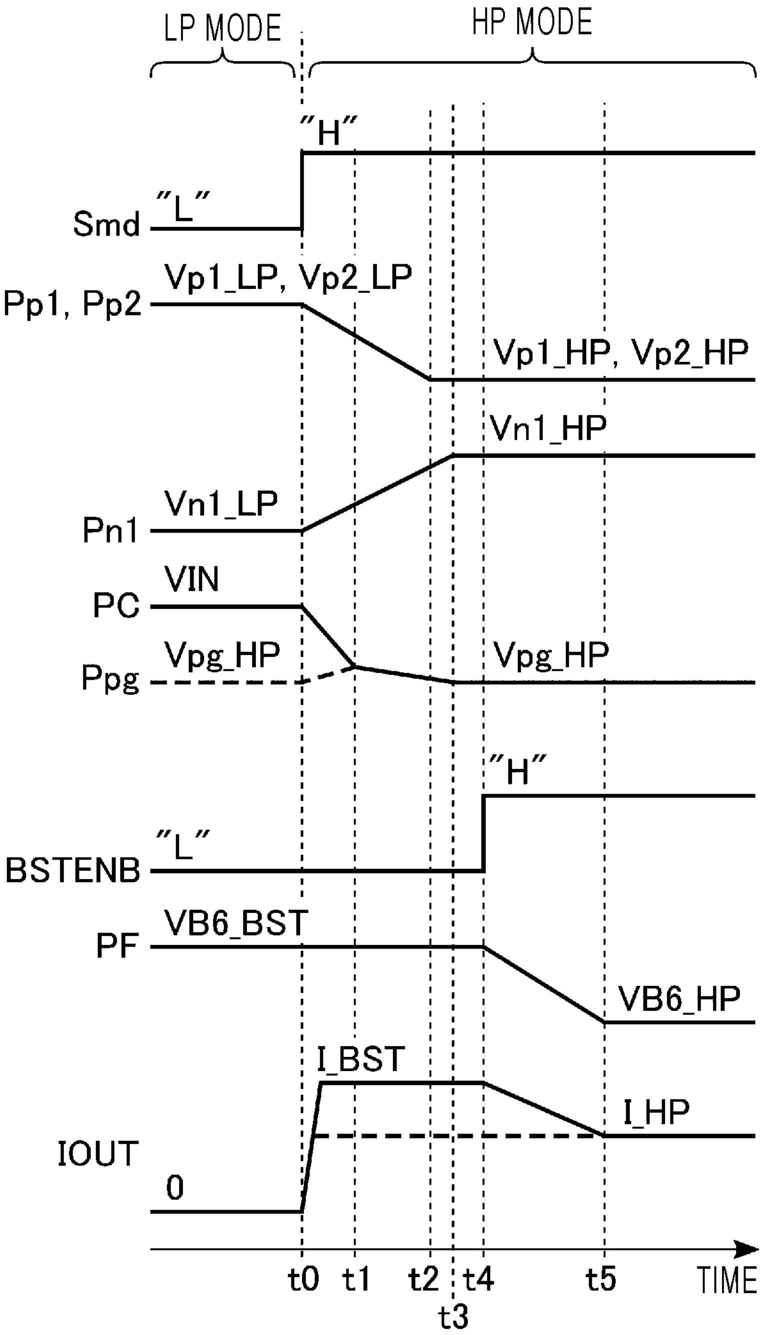
FIG. 18 is a timing chart illustrating the voltage and current of each wiring in the HP mode regulator in the power supply circuit provided in the semiconductor device according to the sixth example of the second embodiment.

Next, the voltage and current of each wiring of the HP mode regulator 33 will be described with reference to FIG. 18. FIG. 18 is a timing chart illustrating the voltage and current of each wiring of the HP mode regulator 33.

As illustrated in FIG. 18, first, at the time t0, the HP mode regulator 33 starts switching from the LP mode to the HP mode. In this example, the period from the time t0 to the time t5 corresponds to the HP stabilization period.

For example, during the period until the time t0, i.e., in the LP mode, the signal BSTENB is set to the "L" level. In this case, the boost circuit 350 is in the boost state. At a point PF of the node N24, the voltage VB6 when the boost circuit 350 is in the boost state is VB6_BST and the voltage VB6 when the boost circuit 350 is in the non-boost state (normal state in the HP mode) is VB6_HP. Then, the voltage VB6_BST and the voltage VB6_HP have a relationship of VB6_BST>VB6_HP. Thus, the voltage VB6_BST is applied to the point PE during the LP mode.

However, since the signal Smd is at the "L" level during the LP mode, the NMOS transistor Mbb2 of the VOUT load current circuit 330 is turned off. Therefore, the output current IOUT does not flow through the VOUT load current circuit 330. In addition, the signal BSTENB may be set to the "H" level during the LP mode.

The voltage variation at the points Pp1, Pp2, Pn1, PC, and Ppg are the same as in the period from the time t0 to the time t3 in FIG. 9 of the second example of the second embodiment.

More specifically, the voltages at the points Pp1 and Pp2 change from the voltage Vp1_LP and the voltage Vp2_LP to the voltage Vp1_HP and the voltage Vp2_HP during the period from the time t0 to the time t2, respectively.

The voltage at the point Pn1 changes from the voltage Vn1_LP to the voltage Vn1_HP during the period from the time t0 to the time t3.

During the period until the time t0, the voltage VIN is applied to the point PC of the node N10, and the voltage Vpg_HP is applied to the point Ppg. Then, at the time t0, the node N10 and the node N13 are connected to each other. At this time, the voltage at the point PC is stabilized to approximately the voltage Vpg_HP by time t1 due to charge sharing with the node N13 connected to the PMOS transistor Mdrv.

The signal BSTENB is switched from the "L" level to the "H" level at the time t4 after, for example, the voltages at the points Pp1, Pp2, Pn1, PC, and Ppg are stabilized. Thereby, the boost circuit 350 ends the boost state. Therefore, the voltage at the point PF changes from the voltage VB6_BST to the voltage VB6_HP during the period from the time t4 to the time t5. At this time, the voltage at the point PF decreases relatively gently due to the influence of the capacitor element CB4. Similarly, the output current IOUT also decreases relatively gently from the current I_BST to the current I_HP during the period from the time t4 to the time t5. By gently changing the output current IOUT, the variation of the output voltage VOUT of the HP mode regulator 33 may be prevented.

2.7 Effects of the Present Embodiment

With the configuration according to the present embodiment, the same effects as those of the first embodiment may be obtained.

With the configuration according to the first example of the present embodiment, the HP mode regulator 33 may apply the voltage Vpg_HP in the HP mode to the gate of the PMOS transistor Mdrv during the LP mode. Thereby, when the charge/discharge period of the gate capacitance of the PMOS transistor Mdrv is dominant for the length of the HP stabilization period, the variation of the gate capacitance of the PMOS transistor Mdrv may be prevented, and the HP stabilization period may be shortened.

With the configuration according to the second example of the present embodiment, the HP mode regulator 33 includes the VOUT load current circuit 330. For example, the load current of the output voltage VOUT may be unknown immediately after switching from the LP mode to the HP mode. Meanwhile, the VOUT load current circuit 330 may flow the preset constant current Irout therethrough in the HP mode. Thereby, the minimum value of the load current of the output voltage VOUT may be set.

With the configuration according to the third example of the present embodiment, the HP mode regulator 33 includes the phase compensation circuit 340 connected to the gate of the PMOS transistor Mdrv which is the output transistor. For example, in case of a regulator having no mode switching circuit 320, when the phase compensation circuit 340 is provided, the gate capacitance of the output transistor becomes large, and therefore, the HP stabilization period tends to be increased. When this time is dominant for the length of the HP stabilization period, this example may prevent the HP stabilization period from being increased according to the variation of the gate capacitance of the PMOS transistor Mdrv by combining the phase compensation circuit 340 with the mode switching circuit 320.

With the configuration according to the fourth example of the present embodiment, the HP mode regulator 33 may apply the voltage Vpg_HP in the HP mode to the capacitor element C2 of the phase compensation circuit 340 during the LP mode. Thereby, when the charge/discharge period of the capacitor element C2 is dominant for the length of the HP stabilization period, the capacitance variation of the capacitor element C2 may be prevented and the HP stabilization period may be shortened.

With the configuration according to the fifth example of the present embodiment, the HP mode regulator 33 may boost the bias current IA+IB in the differential amplifier circuit 310 when switching from the LP mode to the HP mode. Thereby, the period until the voltage of each node is stabilized may be shorted. This may shorten the HP stabilization period.

The sixth example of the present embodiment can obtain the same effect as that of the second example of the present embodiment. Moreover, the HP mode regulator 33 may boost the output current IOUT when switching from the LP mode to the HP mode. Thereby, the variation of the output voltage VOUT of the HP mode regulator 33 may be prevented.

3. Third Embodiment

Next, a third embodiment will be described. In the third embodiment, a case where one regulator circuit corresponds to the HP mode and the LP mode will be described. Hereinafter, differences from the first and second embodiments will be mainly described.

3.1 Configuration of Power Supply Circuit 30

Figure 19:
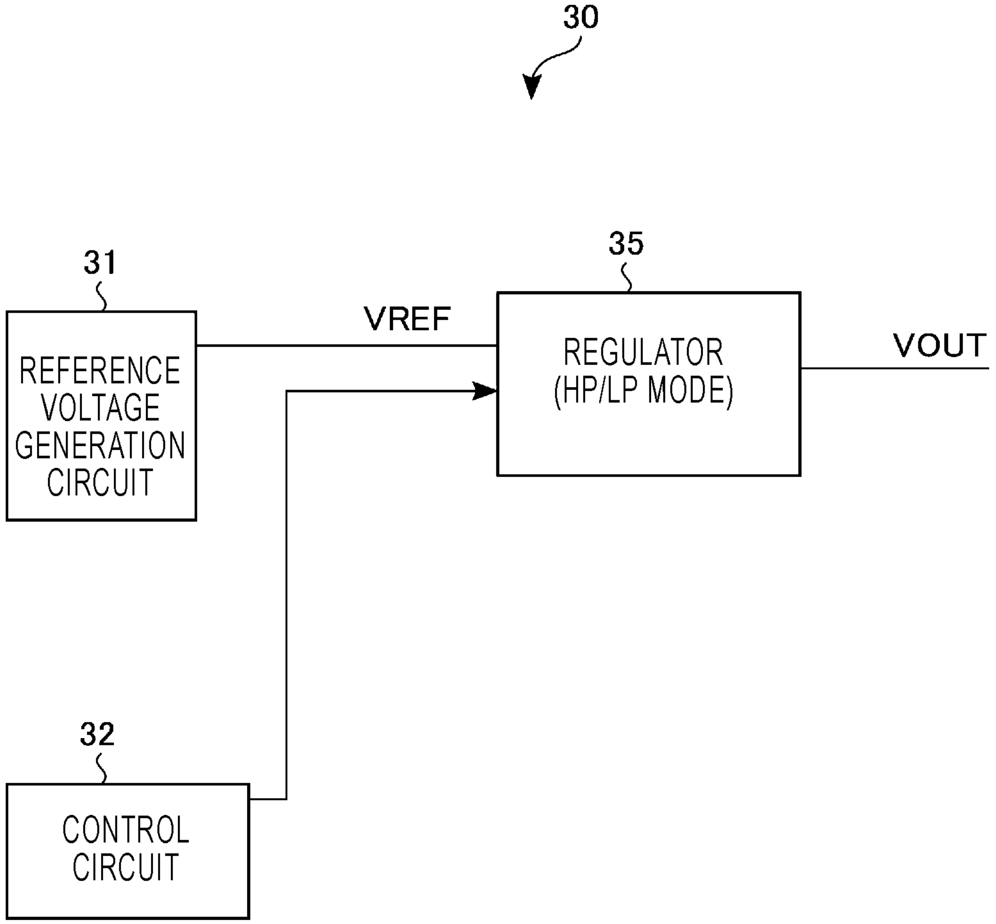
FIG. 19 is a block diagram of the power supply circuit provided in the semiconductor device according to a third embodiment.

First, a configuration of the power supply circuit 30 will be described with reference to FIG. 19. FIG. 19 is a block diagram illustrating an example of a configuration of the power supply circuit 30. The power supply circuit 30 included in the memory chip 10 will be described below, but the power supply circuit 30 included in the memory controller 20 is the same.

As illustrated in FIG. 19, the power supply circuit includes the reference voltage generation circuit 31, the logical control circuit 32, and an HP/LP mode regulator 35.

The reference voltage generation circuit 31 is supplied with, for example, the voltage VCCQ_M (in case of the memory controller 20, the voltage VCCQ_C). The reference voltage generation circuit 31 supplies the reference voltage VREF to the HP/LP mode regulator 35.

The logical control circuit 32 transmits a switching signal Smd (SmdB) between the HP mode and the LP mode and various control signals to the HP/LP mode regulator 35.

The HP/LP mode regulator 35 is a regulator used in the HP mode and the LP mode. The HP/LP mode regulator 35 outputs the voltage VOUT. Details thereof will be described below.

3.2 Configuration of HP/LP Mode Regulator

Figure 20:
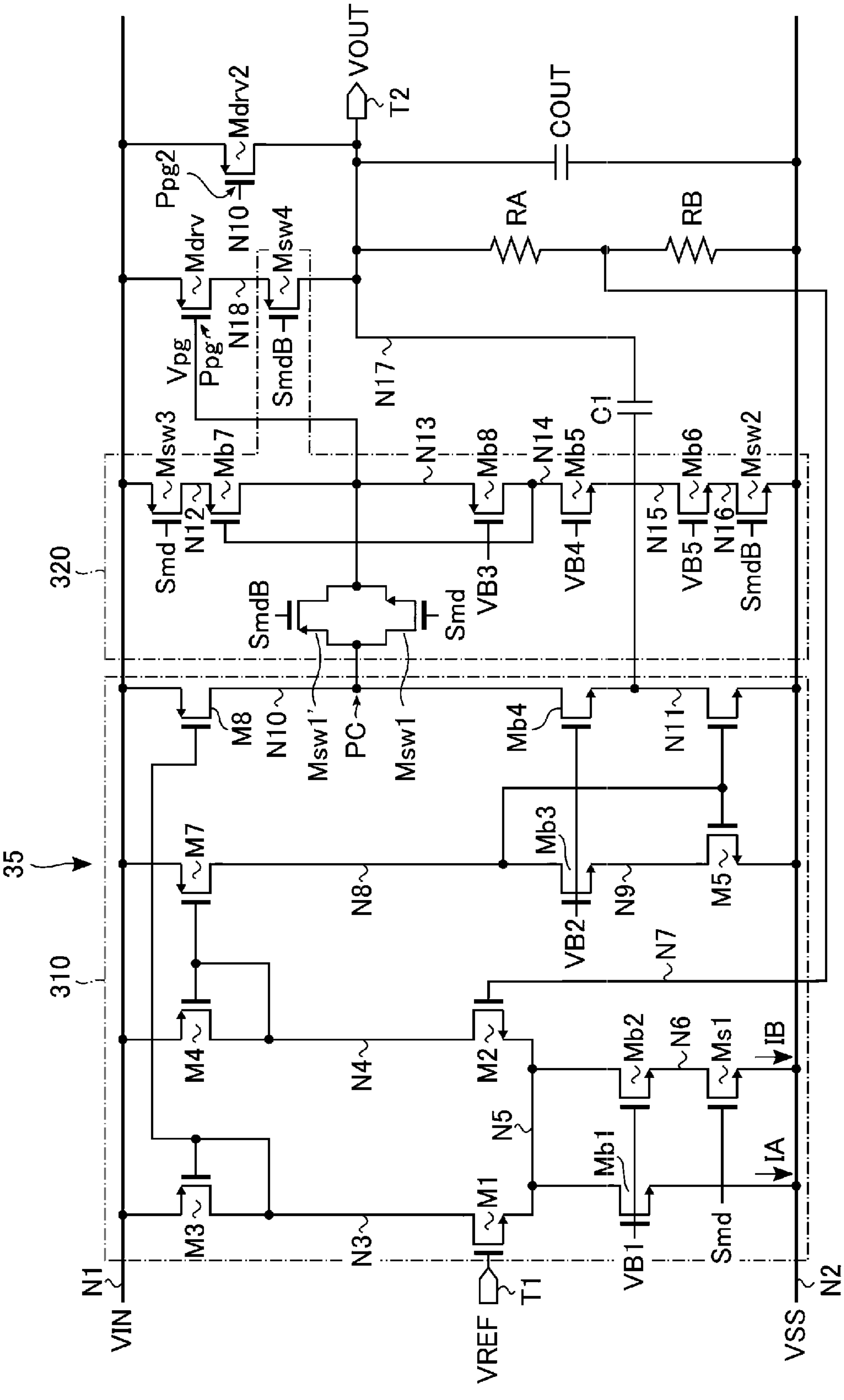
FIG. 20 is a circuit diagram of an HP/LP mode regulator in the power supply circuit provided in the semiconductor device according to the third embodiment.

Next, an example of a configuration of the HP/LP mode regulator 35 will be described with reference to FIG. 20. FIG. 20 illustrates an example of a circuit diagram of the HP/LP mode regulator 35.

As illustrated in FIG. 20, the HP/LP mode regulator 35 includes the terminals T1 and T2, the resistance elements RA and RB, the capacitor elements C1 and COUT, the PMOS transistor Mdrv, a PMOS transistor Mdrv2, the differential amplifier circuit 310, and the mode switching circuit 320.

The connections and configurations of the terminals T1 and T2, the resistance elements RA and RB, the capacitor elements C1 and COUT, the PMOS transistor Mdrv, and the differential amplifier circuit 310 are the same as in FIG. 8 of the first example of the second embodiment.

The PMOS transistor Mdrv functions as an HP mode output driver. Meanwhile, the PMOS transistor Mdrv2 functions as an LP mode output driver. The PMOS transistor Mdrv2 has one end connected to the node N1 and the other end connected to the node N17. A gate of the PMOS transistor Mdrv2 is connected to the node N10.

The mode switching circuit 320 has the same configuration as in the first example of the second embodiment illustrated in FIG. 8 except that the PMOS transistor Msw6 is omitted. More specifically, the mode switching circuit 320 includes the PMOS transistors Msw1', Msw3, Msw4, Mb7, and Mb8, and the NMOS transistors Msw1, Msw2, Mb5, and Mb6.

Each of the PMOS transistor Msw1' and the NMOS transistor Msw1 has one end connected to the node N10 and the other end connected to the node N13. The signal SmdB is input to the gate of the PMOS transistor Msw1'. The signal Smd is input to the gate of the NMOS transistor Msw1. The PMOS transistor Msw1' and the NMOS transistor Msw1 function as a CMOS analog switch. In the LP mode, the gate electrode of the PMOS transistor Mdrv is separated from the differential amplifier circuit 310 by the PMOS transistor Msw1' and the NMOS transistor Msw1.

The PMOS transistor Msw3 has one end connected to the node N1 and the other end connected to the node N12. The signal Smd is input to the gate.

The PMOS transistor Mb7 has one end connected to the node N12, the other end connected to the node N13, and the gate connected to the node N14.

The PMOS transistor Mb8 has one end connected to the node N13 and the other end connected to the node N14. The voltage VB3 is applied to the gate.

The PMOS transistor Msw6 has one end connected to the node N1 and the other end connected to the node N10. The signal Smd is input to the gate.

The NMOS transistor Mb5 has one end connected to the node N14 and the other end connected to the node N15. The voltage VB4 is applied to the gate.

The NMOS transistor Mb6 has one end connected to the node N15 and the other end connected to the node N16. The voltage VB5 is applied to the gate.

The NMOS transistor Msw2 has one end connected to the node N16 and the other end connected to the node N2. The signal SmdB is input to the gate.

The PMOS transistor Msw4 has one end connected to the node N18 and the other end connected to the node N17. The signal SmdB is input to the gate.

3.3 Voltage of Each Wiring of HP/LP Mode Regulator

Figure 21:
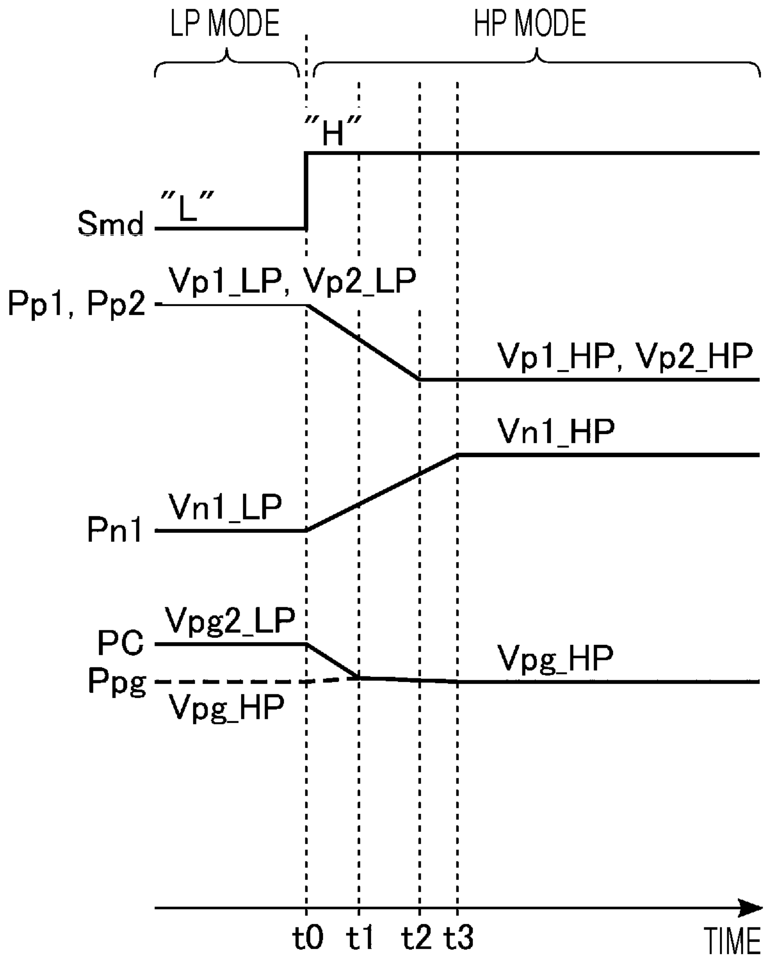
FIG. 21 is a timing chart illustrating the voltage of each wiring in the HP/LP mode regulator in the power supply circuit provided in the semiconductor device according to the third embodiment.

Next, the voltage of each wiring of the HP/LP mode regulator 35 will be described with reference to FIG. 21. FIG. 21 is a timing chart illustrating the voltage of each wiring of the HP/LP mode regulator 35.

As illustrated in FIG. 21, first, at the time t0, the HP/LP mode regulator 35 starts switching from the LP mode to the HP mode. The period from the time t0 to the time t3 corresponds to the HP stabilization period.

The signal Smd and the voltage variation at the points Pp1, Pp2, Pn1, and Ppg are the same as in FIG. 9 of the first example of the second embodiment.

Unlike FIG. 9 of the first example of the second embodiment, in this example, a voltage Vpg2_LP is applied from the differential amplifier circuit 310 to the point PC of the node N10 during the period until the time t0. For example, in the example of FIG. 9, the voltage Vpg_LP having a potential close to the voltage VIN is applied to the point PC until the time t0. Meanwhile, in this example, the voltage Vpg2_LP is applied to the point PC. The voltage Vpg2_LP is a voltage applied to a point Ppg2 of the gate electrode of the PMOS transistor Mdrv2 in the LP mode. The voltage Vpg2_LP has a potential determined by the gate-source voltage Vgs of the PMOS transistor Mdrv2. Accordingly, for example, the voltage Vpg_LP and the voltage Vpg2_LP have a relationship of Vpg_LP>Vpg2_LP.

3.4 Effects of the Present Embodiment

With the configuration according to the present embodiment, the same effects as those of the first and second embodiments may be obtained.

Further, with the configuration according to the present embodiment, the HP/LP mode regulator 35 includes the PMOS transistor Mdrv2. Therefore, both the HP mode and the LP mode may be supported.

Further, with the configuration according to the present embodiment, the voltage Vpg2_LP has the potential determined by the gate-source voltage Vgs of the PMOS transistor Mdrv2. Therefore, the voltage Vpg2_LP may be designed to have the same potential as the voltage Vpg_HP. Thereby, the potential difference between the voltage Vpg2_LP and the voltage Vpg_HP may be made less than the potential difference between the voltage Vpg_LP and the voltage Vpg_HP. Accordingly, the period until stabilization may be shortened by charge sharing.

In addition, a configuration in which the PMOS transistor Msw6 is omitted from the HP mode regulator 33 described in FIG. 5 of the first embodiment or FIG. 15 of the fifth example of the second embodiment may be applied to the HP/LP mode regulator 35.

4. Fourth Embodiment

Next, a fourth embodiment will be described. In the fourth embodiment, a configuration of a memory system different from the first to third embodiments will be described. Differences from the first to third embodiments will be mainly described below.

4.1 Configuration of Memory System

First, an example of a configuration of the memory system will be described with reference to FIG. 22. FIG. is a block diagram illustrating an example of a configuration of the memory system 1.

Figure 22:
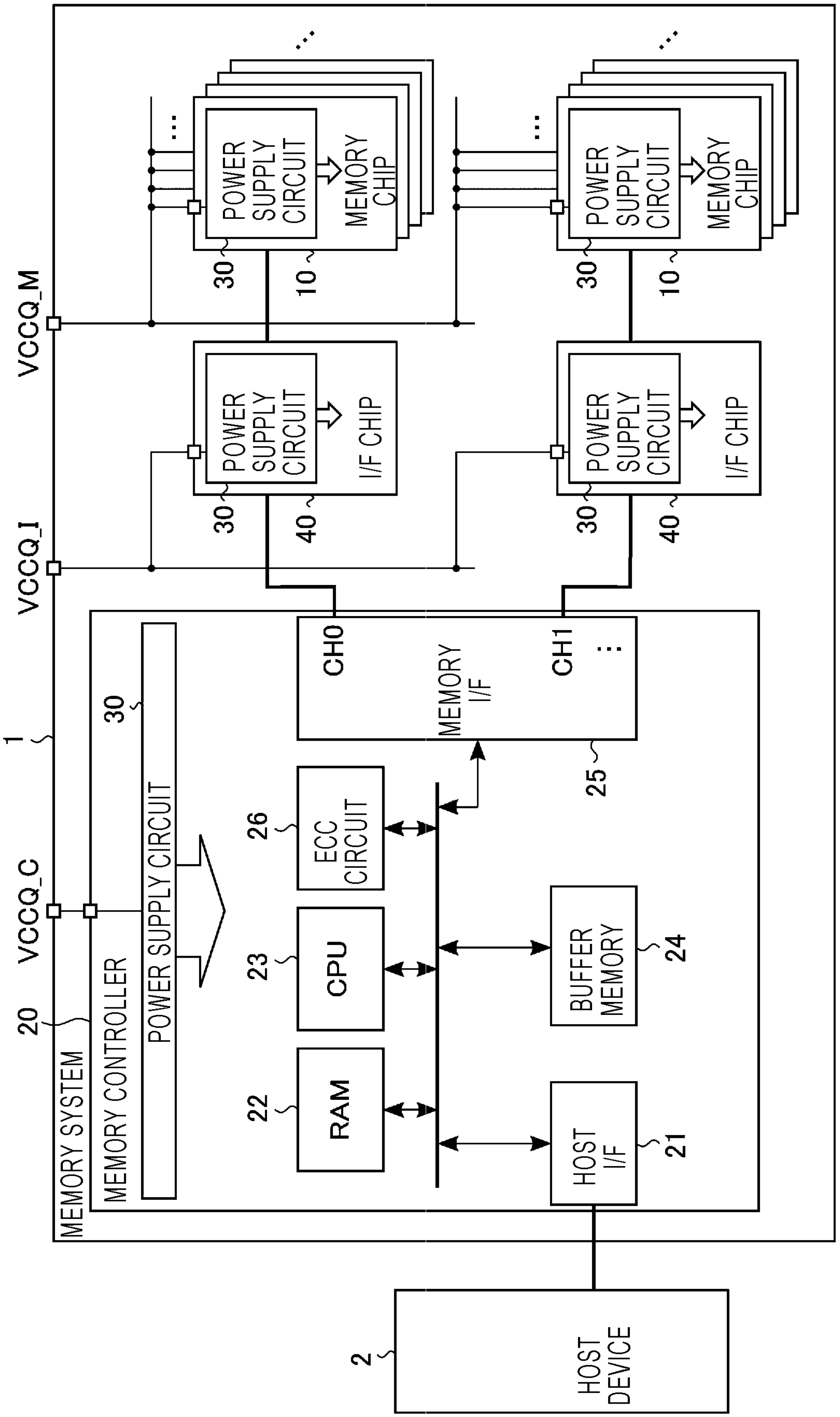
FIG. 22 is a block diagram of the semiconductor device according to a fourth embodiment.

As illustrated in FIG. 22, the memory system 1 includes the plurality of memory chips 10, the memory controller 20, and a plurality of interface chips (I/F chips) 40, and is connected to the external host device 2.

The memory chips 10 and the memory controller 20 are the same as those in FIG. 1 of the first embodiment. The memory interface circuit 25 in the memory controller 20 is connected to the plurality of memory chips 10 via the interface chip 40.

The interface chip 40 may also have a part of the function of the memory interface circuit 25 built into the memory controller 20. By interposing the interface chip 40 between the memory controller 20 and the memory chips 10, the load of the memory controller 20 caused when the memory controller 20 is connected to the plurality of memory chips 10 may be reduced. The interface chip 40 includes the power supply circuit 30, like the memory chip 10 and the memory controller 20. A voltage VCCQ_I is externally applied to the power supply circuit 30 in the interface chip 40. The voltage VCCQ_I may have the same voltage value as the voltage VCCQ_C or the voltage VCCQ_M, or may have a different value. Further, the power supply circuit 30 in the interface chip 40 may have the same configuration as the power supply circuit 30 in the memory chip 10 or the memory controller 20, or may have a different configuration.

4.2 Effects of the Present Embodiment

With the configuration according to the present embodiment, the same effects as those of the first to third embodiments may be obtained.

5. Fifth Embodiment

Next, a fifth embodiment will be described. In the fifth embodiment, an example of an information terminal system using the memory system described in the first to fourth embodiments will be described. Examples of the information terminal system include without limitation mobile phones, cellular phones, smart phones, tablets, phablets, servers, computers, portable computers, desktop computers, personal digital assistants (PDAs), monitors, computer monitors, televisions, tuners, radios, satellite radios, music players, digital music players, portable music players, digital video players, video players, digital video disc (DVD) players, portable digital video players, and automobiles.

5.1 Configuration of Information Terminal System

Figure 23:
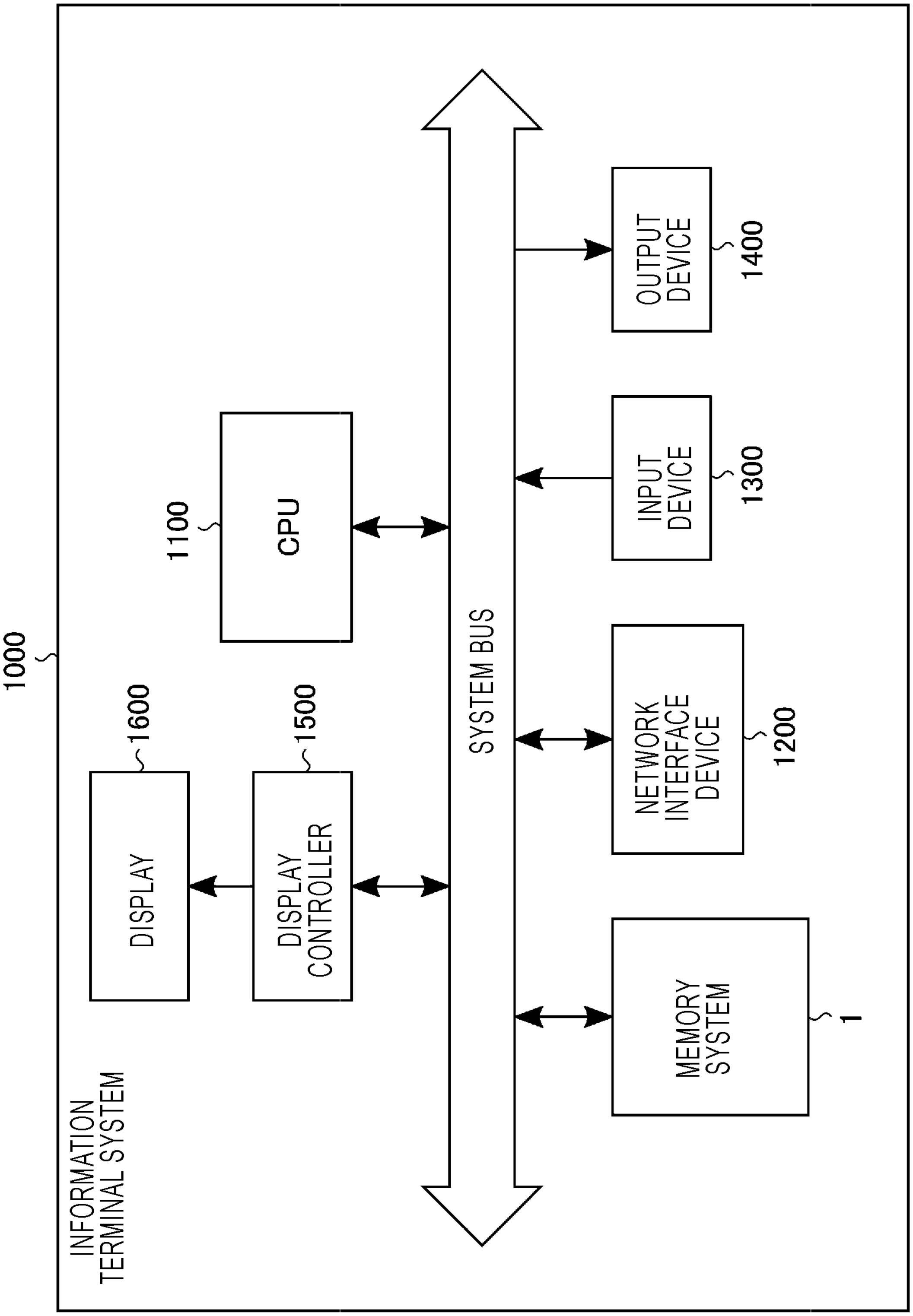
FIG. 23 is a block diagram of an information terminal system including the semiconductor device according to a fifth embodiment.

An example of a configuration of the information terminal system 1000 will be described with reference to FIG. 23. FIG. 23 is a block diagram illustrating an example of a configuration of the information terminal system 1000.

As illustrated in FIG. 23, the information terminal system 1000 includes a CPU 1100, the memory system 1, a network interface device 1200, an input device 1300, an output device 1400, a display controller 1500, and a display 1600.

The CPU 1100 controls the entire information terminal system 1000. The CPU 1100 is connected to a system bus and communicates with other devices by exchanging address information, control information, and data information via the system bus. The CPU 1100 may include a processor and cache memory to provide quick access to temporarily stored data.

The network interface device 1200 is connected to the system bus. The network interface device 1200 may be any device configured to enable the exchange of data with a network. The network may be, for example, a wired or wireless network, a private or public network, a local area network (LAN), a wireless local area network (WLAN), a wide area network (WAN), or BLUETOOTH™. The network interface device 1200 may be configured to support any type of communication protocol if necessary.

The input device 1300 is connected to the system bus. The input device 1300 may include a keyboard, a mouse, input keys, switches, a voice processor for inputting data and others.

The output device 1400 is connected to the system bus. The output device may include a printer, a speaker, and audio, video, and other visual indicators for outputting data.

The display controller 1500 is connected to the system bus. The display controller 1500 converts, for example, display information received from the CPU 1100 into a format suitable for the display 1600 and transmits the display information to the display 1600.

The display 1600 displays the display information received from the display controller 1500. The display 1600 may be any type of display including, for example, a cathode ray tube (CRT), a liquid crystal display (LVD), or a plasma display.

5.2 Effects of the Present Embodiment

With the configuration according to the present embodiment, the same effects as those of the first to fourth embodiments may be obtained.

Moreover, with the configuration according to the present embodiment, the operation mode of the information terminal system may be switched at a high speed. Furthermore, the power consumption of the information terminal system may be reduced.

6. Modifications and Others

The semiconductor device according to the above embodiments includes the regulator 33 having first and second operation modes, and the regulator includes a first transistor Mdrv having one end connected to a power supply voltage wiring (node N1) and a remaining end connected to an output terminal T2, a first resistance element RA having one end connected to the first transistor and the output terminal, a second resistance element RB having one end connected to a remaining end of the first resistance element and a remaining end connected to a ground voltage wiring (node N2), a first circuit 310 connected to a gate of the first transistor to apply a first voltage Vpg depending on a difference between a reference voltage VREF_HP and an output voltage VOUT divided by the first and second resistance elements to the gate of the first transistor, a first bias current IA in the first operation mode (LP mode) being less than a second bias current IA+IB in the second operation mode (HP mode), a first capacitor element C1 having one side electrode connected to the output terminal, and a second circuit 320 connected to a remaining side electrode of the first capacitor element and configured to electrically disconnect the first circuit from the first capacitor element and apply a second voltage Vc1_HP to the first capacitor element in the first operation mode and to electrically connect the first circuit to the first capacitor element in the second operation mode.

The above embodiments provide a semiconductor device capable of improving a processing capacity thereof.

In addition, the embodiments are not limited to the above-described forms, and various modifications thereof are possible. For example, the first to fifth embodiments may be combined as much as possible. For example, the VOUT load current circuit 330 described in FIG. 10 of the second example of the second embodiment may be applied to FIG. 12 of the third example of the second embodiment, and the boost circuit 350 described in FIG. 15 of the fifth example of the second embodiment may be applied thereto.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device having a regulator having first and second operation modes, the regulator comprising:

a first transistor including a first end configured to be connected to a power supply voltage and a second end connected to an output terminal;

a first resistor having a first end connected to the first transistor and the output terminal;

a second resistor having a first end connected to a second end of the first resistor and a second end connected to a ground voltage;

a first circuit configured to apply a first voltage to a gate of the first transistor, wherein the first voltage is determined based on a difference between a reference voltage and an output voltage divided by the first and second resistors, and wherein a first bias current flowing through the first circuit in the first operation mode is less than a second bias current flowing through the first circuit in the second operation mode;

a capacitor including a first electrode connected to the output terminal; and a second circuit connected to a second electrode of the capacitor and configured to: (a) electrically disconnect the first circuit from the first capacitor and apply a second voltage to the first capacitor in the first operation mode, and (b) electrically connect the first circuit to the capacitor in the second operation mode.

2. The semiconductor device according to claim 1, wherein the second voltage is determined based on a third voltage applied to the capacitor in the second operation mode.

3. The semiconductor device according to claim 1, wherein the first circuit includes a second transistor having a source configured to be connected to the ground voltage, and a drain of the second transistor is connected to the second electrode of the capacitor via the second circuit in the second operation mode, and wherein the second voltage is equal to or higher than a drain voltage under which the second transistor operates.

4. The semiconductor device according to claim 1, wherein the second circuit electrically connects the power supply voltage to the gate of the first transistor in the first operation mode.

5. The semiconductor device according to claim 1, wherein the regulator further includes a fifth circuit configured to flow a third bias current greater than the second bias current flowing through the first circuit during a switching period from the first operation mode to the second operation mode.

6. A semiconductor device including a regulator having first and second operation modes, the regulator comprising:

a first transistor including a first end connected to a power supply voltage;

a first resistor including a first end connected to an output terminal;

a second resistor including a first end connected to a second end of the first resistor and a second end connected to a ground voltage;

a first circuit configured to output a first voltage that is determined based on a difference between a reference voltage and an output voltage divided by the first and second resistors, wherein a first bias current flowing through the first circuit in the first operation mode is less than a second bias current flowing through the first circuit in the second operation mode;

a first capacitor having a first electrode connected to the first circuit and a second electrode connected to the output terminal; and a second circuit configured to:

electrically disconnect the first circuit from a gate of the first transistor;

electrically disconnect a second end of the first transistor from the output terminal;

apply a second voltage to the gate of the first transistor in the first operation mode; and electrically connect the first circuit to the gate of the first transistor and electrically connect the second end of the first transistor to the output terminal in the second operation mode.

7. The semiconductor device according to claim 6, wherein the second voltage is equal to the first voltage applied to the gate of the first transistor in the second operation mode.

8. The semiconductor device according to claim 6, wherein the regulator includes a third resistor having a first end connected to the output terminal, and further includes a third circuit configured to electrically disconnect a second end of the third resistor from the ground voltage in the first operation mode and to electrically connect the second end of the third resistor to the ground voltage in the second operation mode.

9. The semiconductor device according to claim 6, wherein the regulator further includes a fourth circuit including a second capacitor having a first electrode connected to the power supply voltage and a fourth resistor having a first end connected to a second electrode of the second capacitor and a second end connected to the gate of the first transistor.

10. The semiconductor device according to claim 6, wherein the regulator further includes:

a fifth circuit including a third transistor having a first end connected to the output terminal and configured to electrically disconnect a second end of the third transistor from the ground voltage in the first operation mode and to electrically connect the second end of the third transistor to the ground voltage in the second operation mode; and a sixth circuit configured to apply a third voltage to a gate of the third transistor during a switching period from the first operation mode to the second operation mode and to apply a fourth voltage lower than the third voltage to the gate of the third transistor after the switching period.

11. A semiconductor device comprising a regulator having first and second operation modes, wherein the regulator includes:

a first transistor including a first end configured to be connected to a power supply voltage;

a first resistor having a first end connected to an output terminal;

a second resistor having a first end connected to a second end of the first resistor and a second end connected to a ground voltage;

a first circuit configured to apply a first voltage to the gate of the first transistor, wherein the first voltage is determined based on a difference between a reference voltage and an output voltage divided by the first and second resistors, wherein a first bias current flowing through the first circuit in the first operation mode is less than a second bias current flowing through the first circuit in the second operation mode;

a first capacitor having a first electrode connected to the first circuit and a second electrode connected to the output terminal;

a second circuit including a second capacitor having a first electrode connected to the power supply voltage and a fourth resistor having a first end connected to a second electrode of the second capacitor; and a third circuit configured to:

electrically disconnect the second circuit from the gate of the first transistor and electrically disconnect a second end of the first transistor from the output terminal in the first operation mode; and electrically connect the second circuit to the gate of the first transistor and electrically connect the second end of the first transistor to the output terminal in the second operation mode.

12. The semiconductor device according to claim 11, wherein the third circuit is further configured to electrically connect the power supply voltage to the gate of the first transistor in the first operation mode.

13. A semiconductor device comprising a regulator having first and second operating modes, wherein the regulator includes:

a first transistor including a first end connected to a power supply voltage;

a fourth transistor including a first end connected to the power supply voltage and a second end connected to an output terminal;

a first resistor having a first end connected to the output terminal;

a second resistor having a first end connected to a second end of the first resistor and a second end connected to a ground voltage;

a first circuit configured to apply a first voltage to a gate of the fourth transistor, wherein the first voltage is determined based on a difference between a reference voltage and an output voltage divided by the first and second resistors, and wherein a first bias current flowing through the first circuit in the first operation mode is less than a second bias current flowing through the first circuit in the second operation mode;

a capacitor having a first electrode connected to the first circuit and a second electrode connected to the output terminal; and a second circuit configured to:

electrically disconnect the first circuit from a gate of the first transistor;

electrically disconnect a second end of the first transistor from the output terminal;

apply a second voltage to the gate of the first transistor in the first operation mode; and electrically connect the first circuit to the gate of the first transistor and electrically connect the second end of the first transistor to the output terminal in the second operation mode.

14. A memory system comprising:

a plurality of memory chips, each of which includes an instance of a regulator having first and second operation modes; and a memory controller that includes another instance of the regulator and is connected to the plurality of memory chips, wherein the regulator includes:

a first transistor including a first end connected to a power supply voltage;

a first resistor having a first end connected to an output terminal;

a second resistor having a first end connected to a second end of the first resistor and a second end connected to a ground voltage;

a first circuit configured to output a first voltage, wherein the first voltage is determined based on a difference between a reference voltage and an output voltage divided by the first and second resistors, and wherein a first bias current flowing through the first circuit in the first operation mode is less than a second bias current flowing through the first circuit in the second operation mode;

a capacitor having a first electrode connected to the first circuit and a second electrode connected to the output terminal; and a second circuit configured to:

electrically disconnect the first circuit from a gate of the first transistor;

electrically disconnect a second end of the first transistor from the output terminal;

apply a second voltage to the gate of the first transistor in the first operation mode; and electrically connect the first circuit to the gate of the first transistor and electrically connect the second end of the first transistor to the output terminal in the second operation mode.

15. The memory system according to claim 14, wherein, when selecting one of the plurality of memory chips, the memory controller switches an operation mode of the selected memory chip from the first operation mode to the second operation mode.

* * * * *